United States Patent
Kato et al.

(10) Patent No.: US 8,790,549 B2
(45) Date of Patent: Jul. 29, 2014

(54) ELECTRONIC COMPONENT PROVIDED WITH CU—AL—CO-BASED ALLOY ELECTRODE OR WIRING

(75) Inventors: Takahiko Kato, Hitachinaka (JP); Takashi Naito, Funabashi (JP); Hiroki Yamamoto, Hitachi (JP); Takuya Aoyagi, Hitachi (JP); Seiichi Watanabe, Sapporo (JP); Seiji Miura, Sapporo (JP); Norihito Sakaguchi, Sapporo (JP); Kazuki Aoshima, Samukawa (JP); Kenji Ohkubo, Tabetsu (JP)

(73) Assignee: Hitachi, Ltd., Tokyo (JP)

(*) Notice: Subject to any disclaimer, the term of this patent is extended or adjusted under 35 U.S.C. 154(b) by 468 days.

(21) Appl. No.: 13/263,359

(22) PCT Filed: Apr. 8, 2010

(86) PCT No.: PCT/JP2010/002573
§ 371 (c)(1),
(2), (4) Date: Nov. 14, 2011

(87) PCT Pub. No.: WO2010/116746
PCT Pub. Date: Oct. 14, 2010

(65) Prior Publication Data
US 2012/0285733 A1   Nov. 15, 2012

(30) Foreign Application Priority Data

Apr. 10, 2009   (JP) ................. 2009-095628

(51) Int. Cl.
H01B 1/02 (2006.01)
H05K 1/09 (2006.01)
C22C 9/00 (2006.01)
C22C 9/02 (2006.01)
C22C 9/01 (2006.01)
C22C 9/06 (2006.01)

(52) U.S. Cl.
CPC .... *C22C 9/01* (2013.01); *C22C 9/06* (2013.01)
USPC ............ 252/513; 174/257; 420/489; 420/496

(58) Field of Classification Search
None
See application file for complete search history.

(56) References Cited

U.S. PATENT DOCUMENTS

| | | | | |
|---|---|---|---|---|
| 2,130,737 | A | * | 9/1938 | Hensel et al. ............... 420/490 |
| 5,468,310 | A | * | 11/1995 | Fujiki et al. ................ 148/435 |
| 5,731,066 | A | | 3/1998 | Ando et al. |
| 2007/0262716 | A1 | | 11/2007 | Kifune et al. |
| 2009/0166217 | A1 | * | 7/2009 | Jha et al. .................... 205/560 |

FOREIGN PATENT DOCUMENTS

| | | |
|---|---|---|
| JP | 8-125341 | 5/1996 |
| JP | 9-199976 | 7/1997 |
| JP | 2002-294437 | 10/2002 |
| JP | 2003-277170 | 10/2003 |
| JP | 2004-91907 | 3/2004 |
| JP | 2004-207009 | 7/2004 |
| JP | 2007-305528 | 11/2007 |

OTHER PUBLICATIONS

Mi, S. et al., "A study of the ternary phase diagrams of Al—Co with Cu, Ag and Au," J. Alloys and Compounds, 354, pp. 148-152 (2003).*
Cai, J., et al., "Producing ternary intermetallic compounds powders by solid-liquid reaction ball milling," J. Mater. Sci., 45, pp. 3438-3441 (2010).*

* cited by examiner

*Primary Examiner* — Harold Pyon
*Assistant Examiner* — Jaison Thomas
(74) *Attorney, Agent, or Firm* — Antonelli, Terry, Stout & Kraus, LLP

(57) ABSTRACT

An object of the present invention is to provide an electronic component using a Cu-based conductive material that can suppress oxidization even in a heat treatment in an oxidizing atmosphere and that can suppress an increase in an electrical resistance. In an electronic component having an electrode or a wiring, a ternary alloy made from three elements consisting of Cu, Al, and Co is used as a Cu-based wiring material that can prevent oxidization of the electrode or the wiring. Specifically, part or the whole of the electrode or the wiring has a chemical composition in which an Al content is 10 at % to 25 at %, a Co content is 5 at % to 20 at %, and the balance is composed of Cu and unavoidable impurities, and the chemical composition represents a ternary alloy in which two phases of a Cu solid solution formed by Al and Co being dissolved into Cu and a CoAl intermetallic compound coexist together.

10 Claims, 18 Drawing Sheets

Cu-Al-Co ALLOY PHASE DIAGRAM

Al-Co-Cu ALLOY PHASE DIAGRAM

FIG. 17
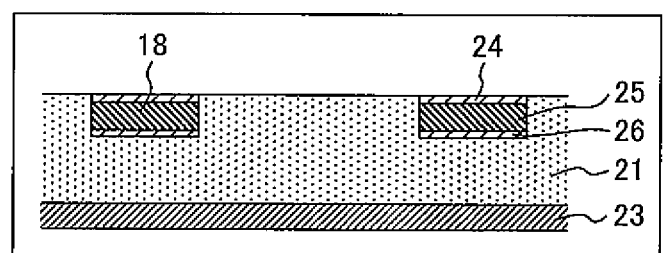
(a)
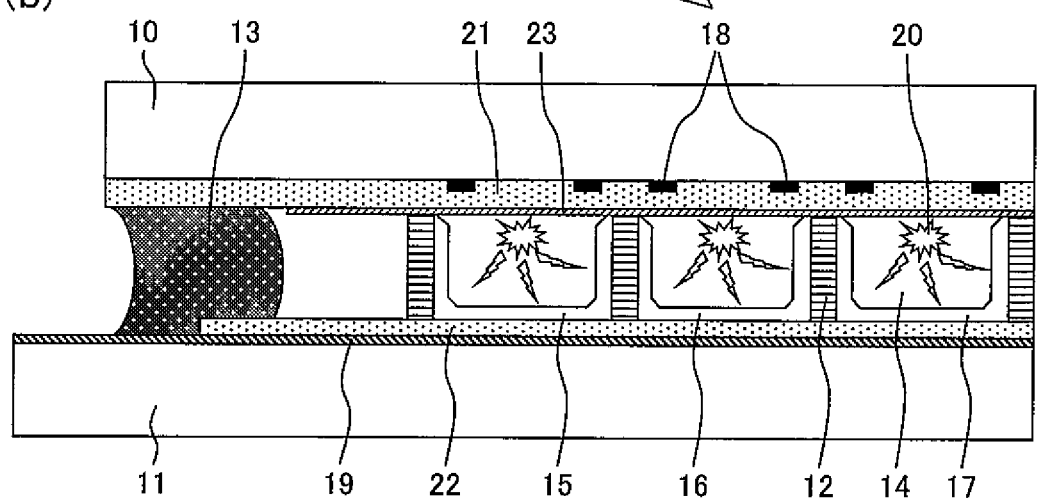
(b)
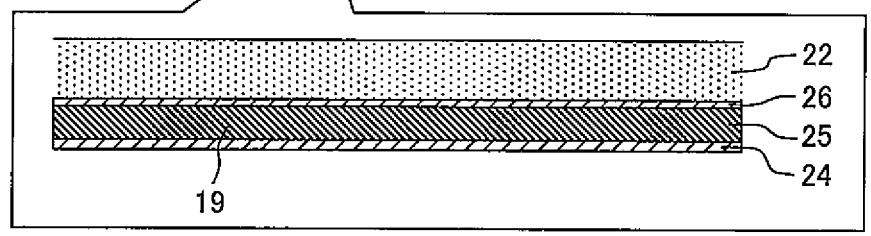
(c)

BIG BUBBLE

ELECTRONIC COMPONENT PROVIDED WITH CU—AL—CO-BASED ALLOY ELECTRODE OR WIRING

TECHNICAL FIELD

The present invention relates to a Cu-based electrode or wiring material that can suppress oxidization, and to an electronic component using the Cu-based electrode or wiring material in an electrode, a wiring, or a contact part.

BACKGROUND ART

When an electronic component having conductive members, such as a wiring, an electrode, and a contact part, can be produced by adopting a production process during which the electronic component is not exposed to an oxidizing atmosphere, pure Cu is used as a wiring or electrode material, as represented by an LSI wiring. On the other hand, in a typical production process for, such as a large-sized plasma display, a metal wiring is embedded in a glass dielectric and subjected to a heat treatment in an oxidizing atmosphere in a high temperature region of, for example, 400° C. or higher, during the production process. In addition, an electrode in a solar cell, low-temperature co-fired ceramics (LTCC), or the like, is produced in a process in which the electrode is fired in the atmosphere at a further higher temperature. Accordingly, an Ag wiring, or the like, having resistance to oxidation even in a high temperature heat treatment (reduced at a high temperature) has been put into practical use for a conductive member handled in a high temperature production process associated with an oxidizing atmosphere. Accordingly, it is strongly desired to use a Cu-based material having high reliability in a wiring in terms of cost reduction and improvement in the migration resistance property. However, Cu causes the troubles that Cu lacks conductivity due to an oxidation occurring at a temperature higher than 200° C., and that bubbles, etc., are remarkably generated in a glass dielectric when Cu is in contact with the glass dielectric, or the like. Accordingly, under the present circumstances, the use of pure Cu metal alone in wiring has not been put into practical use in the electronic component products handled in a high temperature production process associated with an oxidizing atmosphere.

In a conventional technique, an electronic component material has been known in which the weatherability of Cu as a whole is improved by containing Cu as a main component and 0.1 to 3.0% by weight of Mo, and by uniformly mixing Mo into grain boundaries of Cu (e.g., Patent Document 1). In the conventional technique, addition of Mo is essential and an attempt for further improving the weatherability in comparison with the case where only Mo is added, has been made in which a total amount of 0.1 to 3.0% by weight of one or more elements selected from the group consisting of Al, Au, Ag, Ti, Ni, Co, and Si as well as Mo are added. However, it is pointed out that, in the alloy, addition of a total amount of 3.0% by weight or more of one or more elements selected from the group consisting of Al, Au, Ag, Ti, Ni, Co, and Si adversely deteriorates the weatherability. In addition, because the addition of Mo is essential, there has been the problem that the material is high in cost, and accordingly is not suitable for the practical use of electronic component products of low market cost.

PRIOR ART DOCUMENT

Patent Document

[Patent Document 1]
Japanese Patent Application Publication No. 2004-91907

DISCLOSURE OF THE INVENTION

Problem to be Solved by the Invention

It is strongly desired in terms of cost reduction and improvement in migration resistance property that a Cu-based material having high reliability may be used in wiring as a conductive member, such as a wiring, an electrode, a contact material, to be used in an electronic component. As stated above, however, when a Cu-based material is used as a wiring or electrode material, there is the problem that an electrode or a wiring itself made of the Cu-based material lacks conductivity due to the oxidization occurring in a high temperature production process associated with an oxidizing atmosphere, or that bubbles are generated in glass or glass ceramics in the interface with the Cu-based wiring material when the Cu-based wiring material is in contact with a glass dielectric. This is because: when the Cu-based material is, during its production process, produced by a method including a high temperature heat treatment process performed in an oxidizing atmosphere at 200° C. or higher, particularly 400° C. or higher, a conductive member made of pure Cu or a Cu-based metal is oxidized, thereby losing the conduction in the metal portion; or an oxide layer formed on the surface of pure Cu or a Cu-based metal reacts at a high temperature with the glass or glass ceramics in contact therewith, thereby forming bubbles. With the generation of the bubbles, a problem of a decrease in a withstand voltage, or the like, is caused, and hence there has been the problem that it is difficult to produce these electronic components. Herein, the case where a Cu-based wiring material is in contact with a glass dielectric includes the case where the material in contact with a wiring is glass or glass ceramics and the case where a wiring itself contains a glass component.

In view of the aforementioned problems, an object of the present invention is to provide an electronic component using a Cu-based conductive member that can suppress oxidation even in a heat treatment performed in an oxidizing atmosphere and can suppress an increase in the electrical resistance. Another object of the invention is to provide an electronic component using a Cu-based conductive member that can suppress generation of bubbles in glass or glass ceramics and is excellent in migration resistance property, in electronic components having a structure in contact with the glass or glass ceramics.

Means for Solving the Problems

In an electronic component having an electrode or a wiring, the present invention uses a ternary alloy made from three elements consisting of Cu, Al, and Co, as a Cu-based wiring material that can prevent oxidization of the electrode or the wiring. Specifically, part or the whole of the electrode or the wiring has a chemical composition in which an Al content is 10 at % to 25 at %, a Co content is 5 at % to 20 at %, and the balance is composed of Cu and unavoidable impurities, and the chemical composition represents a ternary alloy in which two phases of a Cu solid solution formed by Al and Co being dissolved into Cu and a CoAl intermetallic compound coexist together. Further, the electronic component has a structure in which the electrode or the wiring is in contact with a glass or glass ceramics member.

The unavoidable impurities contained in the ternary alloy according to the present invention include elements brought thereinto from alloy raw materials during the production process of the alloy and elements mixed during the production process. It is desirable to make the content of the unavoidable impurities to be 1% by weight or less. The forms of the wiring or the electrode in contact with a glass or glass ceramics member include, for example: a structure in which the wiring or the electrode is formed on the surface of the glass or glass ceramics member; a structure in which the surface of the wiring or the electrode is covered with the glass or glass ceramics member; a structure in which the wiring or the electrode is formed in a hole provided in the glass or glass ceramics member, and the like.

With the provision of the present alloy, an electronic component having a Cu-based wiring material that can prevent the oxidization of a Cu-based electrode or wiring, that can also suppress generation of bubbles in glass or glass ceramics when the electronic component has a structure in which the electrode or wiring is in contact with the glass or glass ceramics, and that is excellent in migration resistance property, can be produced.

Further, with the provision of the aforementioned alloy according to the present invention, a Cu-based electrode, wiring, or contact part material that can suppress oxidization even in a heat treatment in an oxidizing atmosphere and that can also suppress an increase in electrical resistance, can be provided.

The present invention is an electrode or wiring material made by mixing at least conductive metal material powders and glass powders and then by firing the mixture, the conductive metal component of which is composed of an Al content of 10 at % to 25 at %, a Co content of 5 at % to 20 at %, and the balance of Cu and unavoidable impurities.

Advantages of the Invention

According to the present invention, a Cu-based conductive member that can suppress oxidization even in a heat treatment in an oxidizing atmosphere and that can suppress an increase in an electrical resistance, and an electronic component using the Cu-based conductive member can be provided. Further, in an electronic component having a wiring in contact with a glass or glass ceramics member, an electronic component using a Cu-based wiring material that can suppress generation of bubbles in the glass or glass ceramics and is excellent in migration resistance property, can be provided.

BRIEF DESCRIPTION OF THE DRAWINGS

FIG. 17 are sectional views of the plasma display using the wiring material according to the present invention produced by a sputtering method;

EMBODIMENTS FOR CARRYING OUT THE INVENTION

Hereinafter, results of the research by the present inventors through which the present invention has been made and embodiments of the invention will be described in detail.

Figure 1:
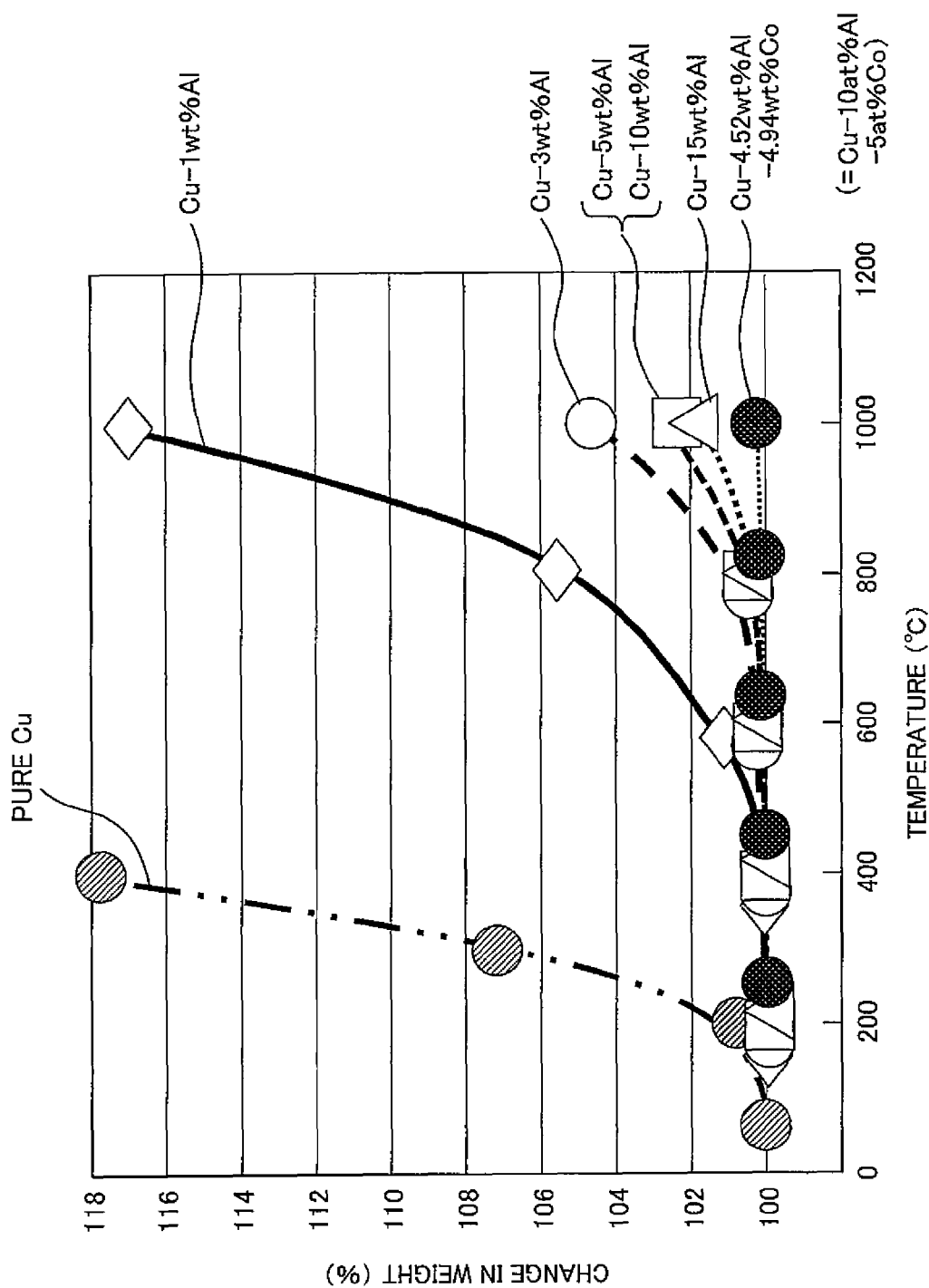
FIG. 1 is a graph illustrating relationships between increases in weight occurring due to oxidization during thermal analyses of various Cu-based materials in the atmosphere, and temperatures.
Figure 2:
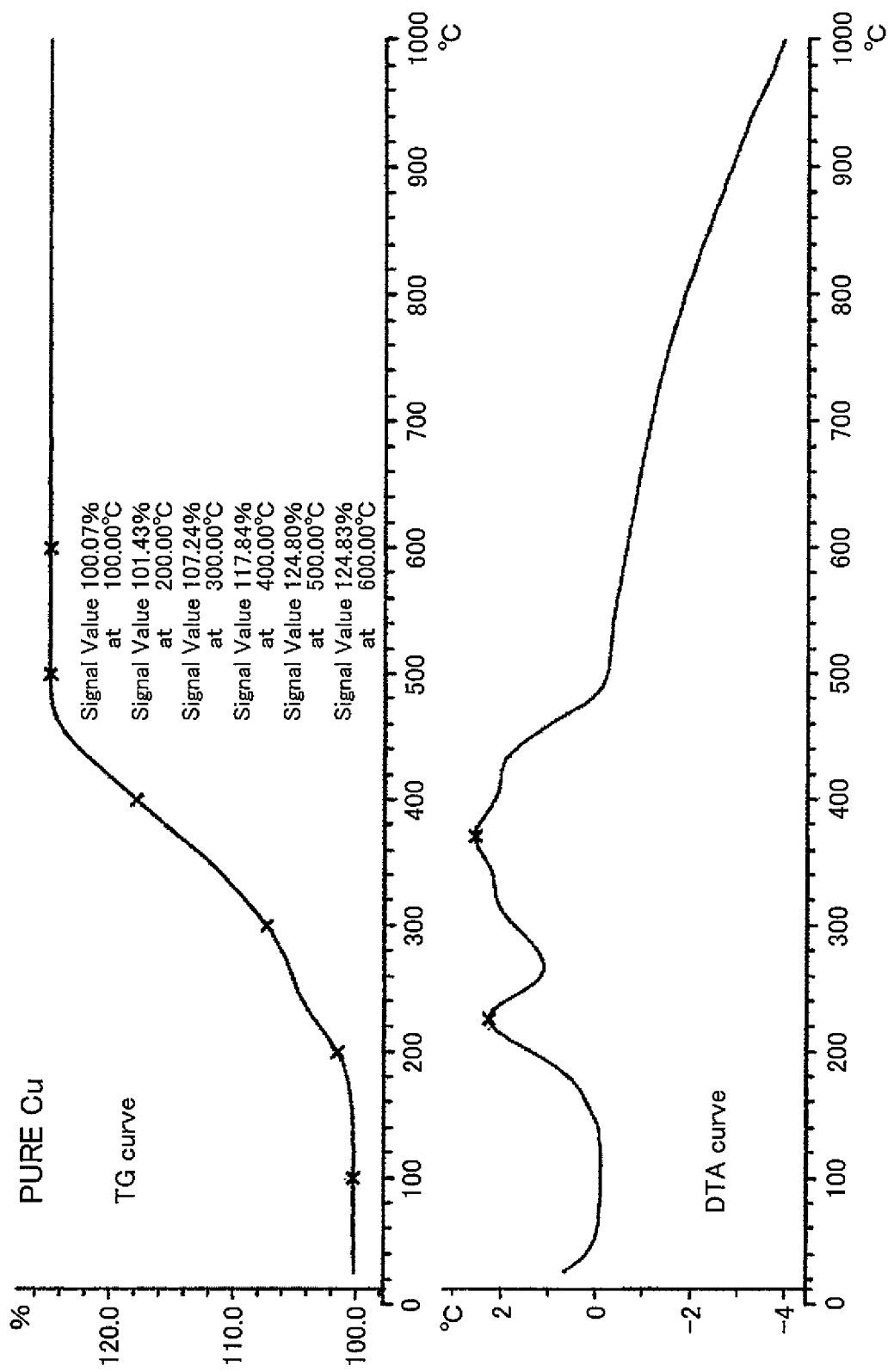
FIG. 2 is a graph illustrating results of the thermal analysis of pure Cu.
Figure 3:
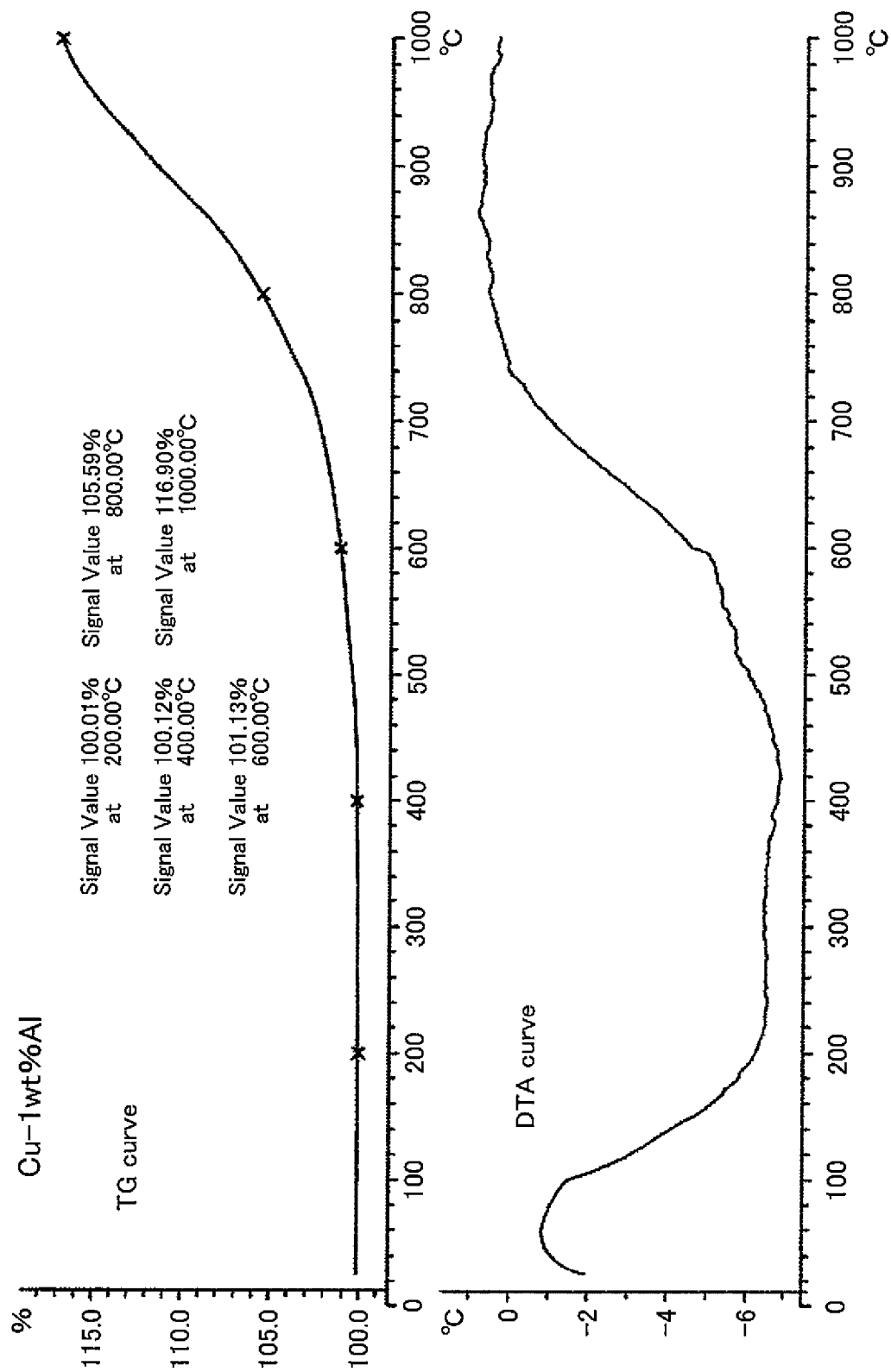
FIG. 3 is a graph illustrating results of the thermal analysis of Cu-1 wt % Al alloy.
Figure 4:
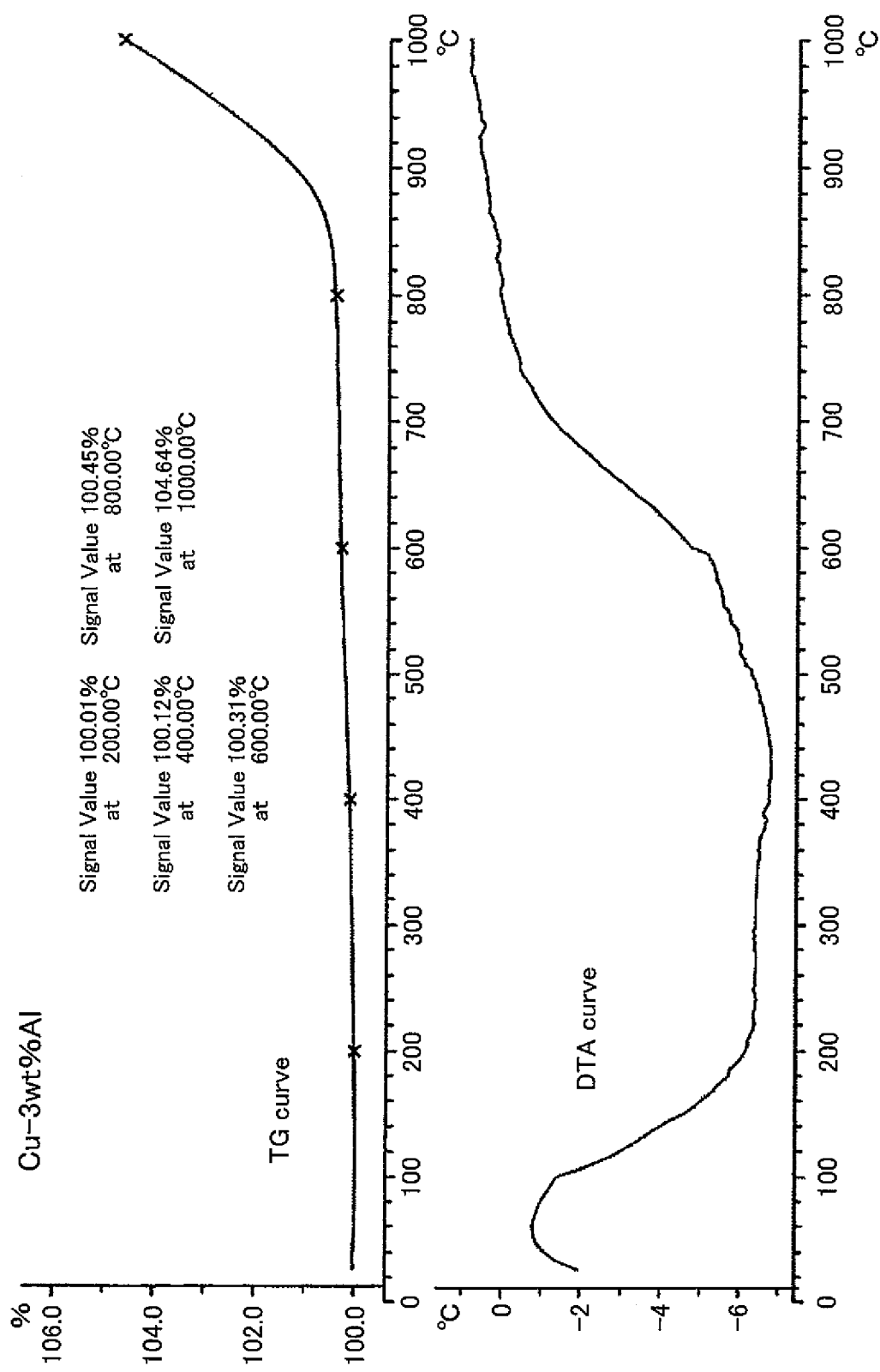
FIG. 4 is a graph illustrating results of the thermal analysis of Cu-3 wt % Al alloy.
Figure 5:
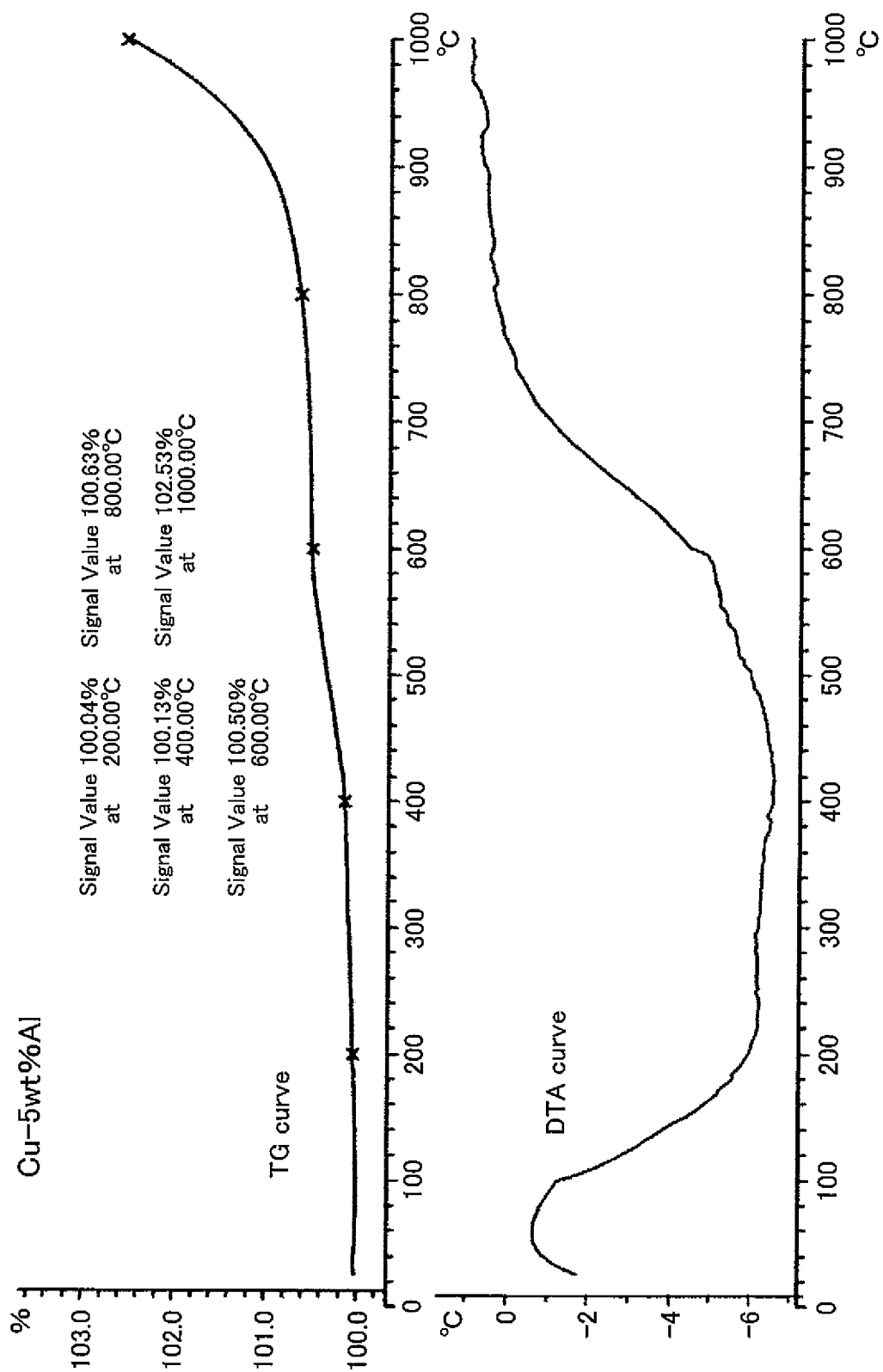
FIG. 5 is a graph illustrating results of the thermal analysis of Cu-5 wt % Al alloy.
Figure 6:
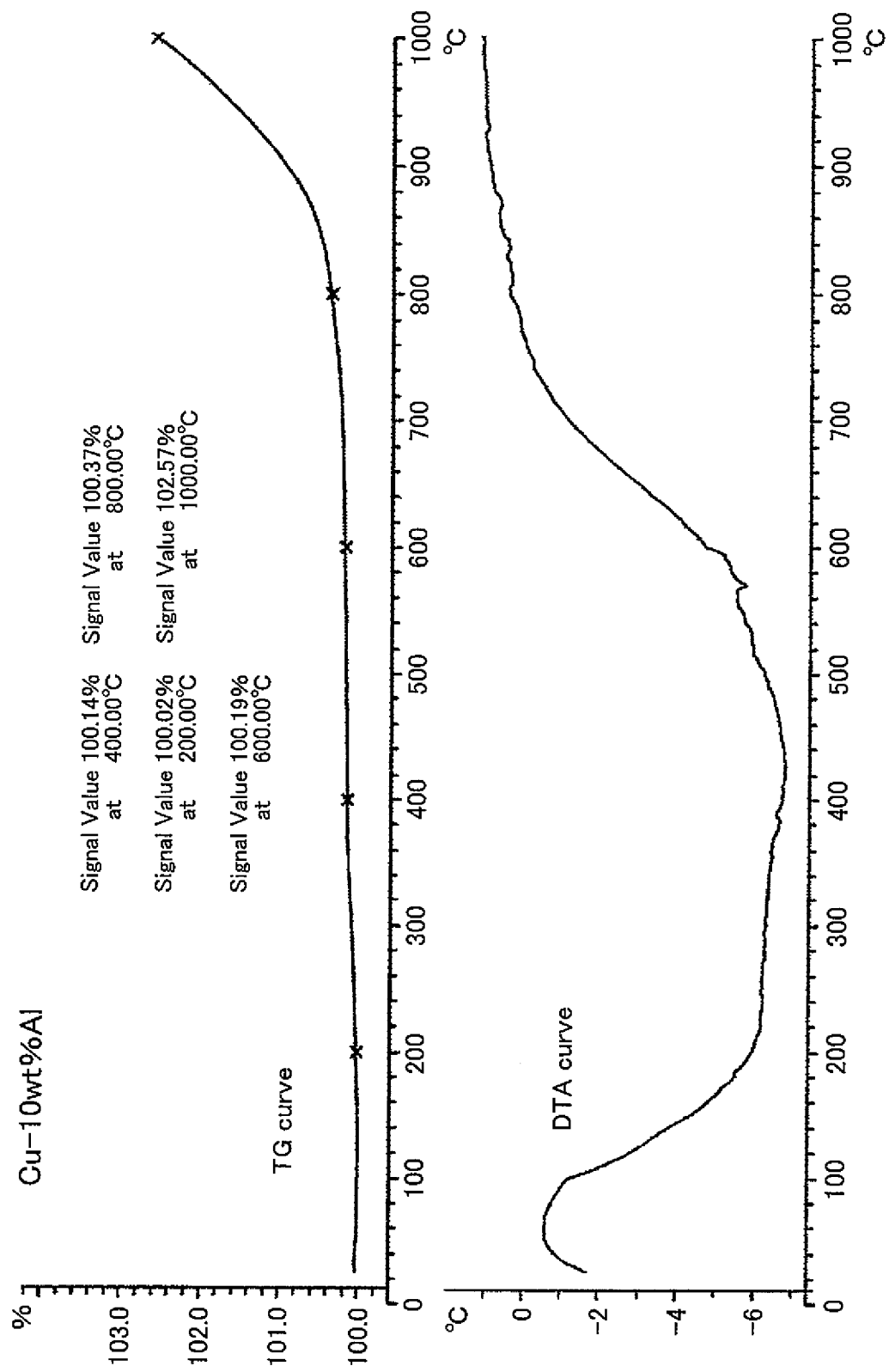
FIG. 6 is a graph illustrating results of the thermal analysis of Cu-10 wt % Al alloy.
Figure 7:
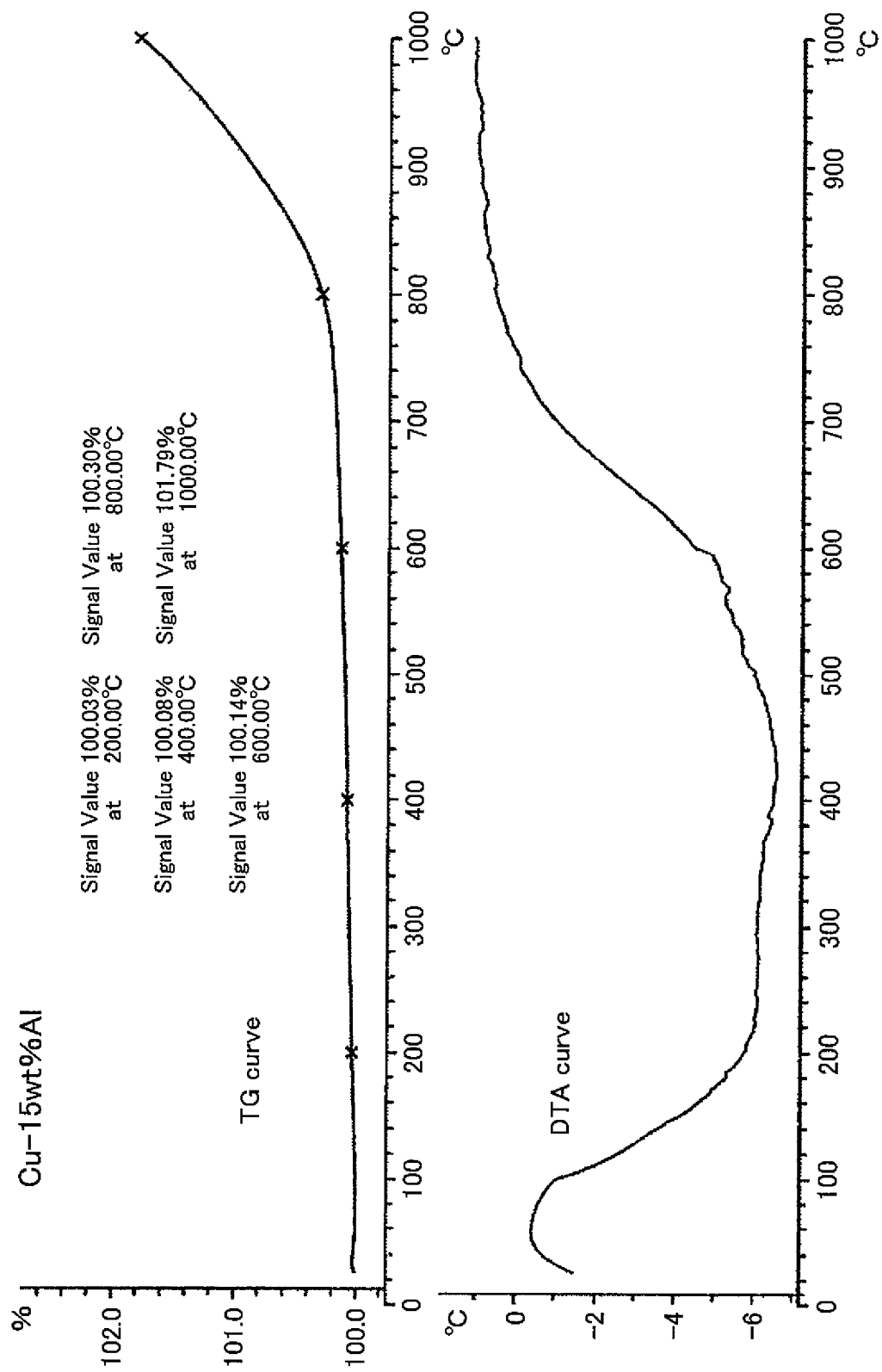
FIG. 7 is a graph illustrating results of the thermal analysis of Cu-15 wt % Al alloy.
Figure 8:
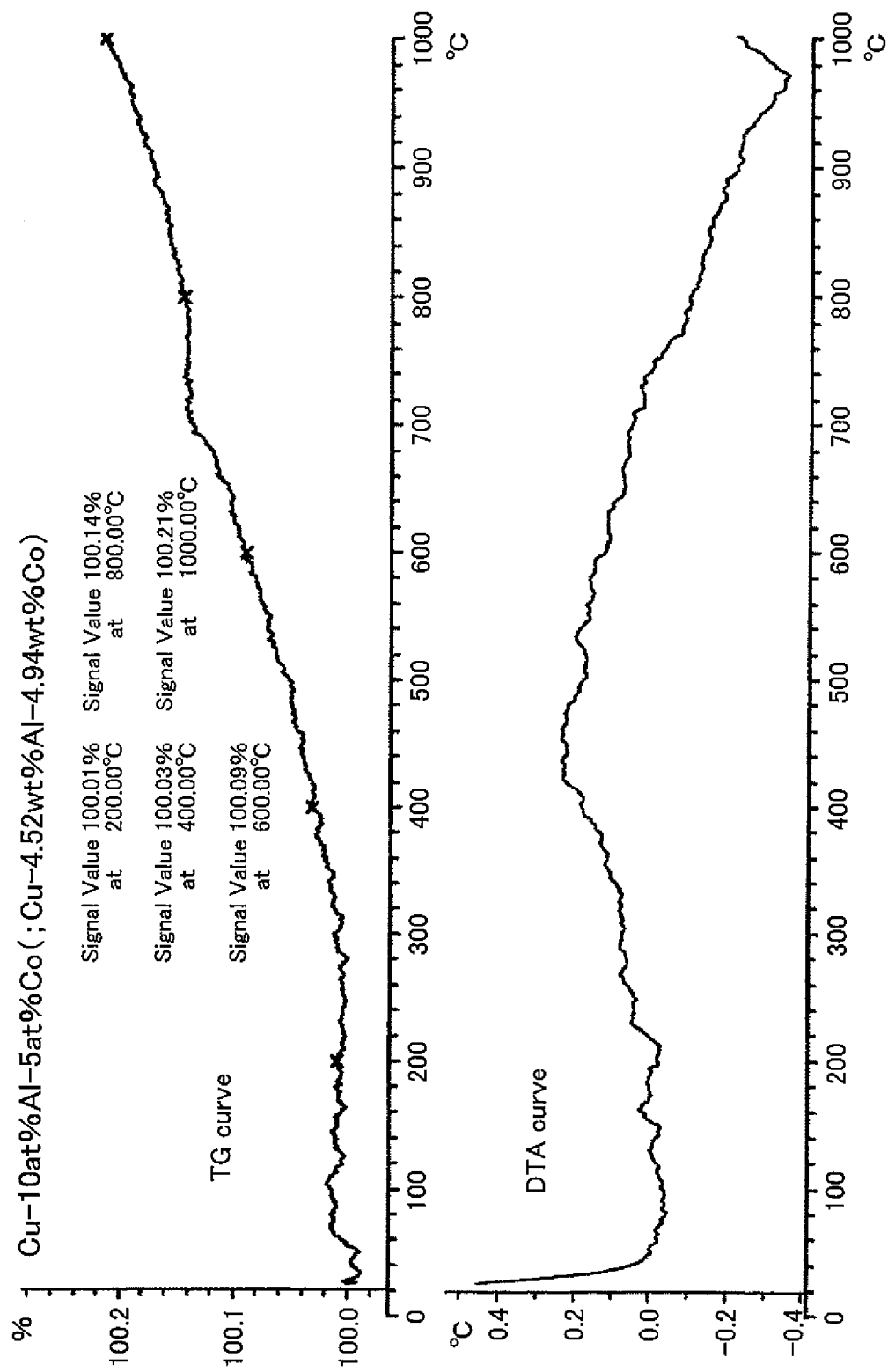
FIG. 8 is a graph illustrating results of the thermal analysis of Cu-10 at % Al-5 at % Co alloy.

FIG. 1 illustrates results of measuring increases in weight occurring due to oxidization, by performing, in the atmosphere, thermal analyses (TG-DTA) on pure Cu and Cu—Al-based binary alloys, both of which are used as comparative materials, and Cu—Al—Co-based ternary alloys according to the present invention. In FIGS. 2 to 8, the results of measurement were illustrated by TG curves (Thermogravimetry curves) and DTA curves (Differential Thermal Analysis curves). An increase in weight was plotted with respect to the temperature during the thermal analysis. In this case, the thermal analysis was performed at a rate of heat increase of 10° C./min. It can be found that pure Cu causes remarkable oxidization at a temperature of 200° C. or higher and accordingly the weight is increased, but when Al is added, the increase in weight occurring due to oxidization, can be suppressed with an increase in the addition amount thereof. With respect to such behaviors, a ternary alloy in which Co has been added in a Cu—Al alloy exhibits an extremely good oxidation resistance property even at a temperature of 800° C. or higher where other comparative materials exhibit a remarkable oxidation phenomenon, thereby hardly causing an increase in weight. The Cu—Al—Co-based ternary alloy used herein has a chemical composition of Cu-10 at % Al-5 at % Co (Cu-4.52 wt % Al-4.94 wt % Co), and an increase in weight at a temperature of, for example, 1000° C. was mere 0.21%. FIGS. 2 to 7 are adopted as the evidence data for FIG. 1, because they illustrate raw data of the results of the actual thermal analyses (TG-DTA) measurement used in the creation of FIG. 1.

Figure 9:
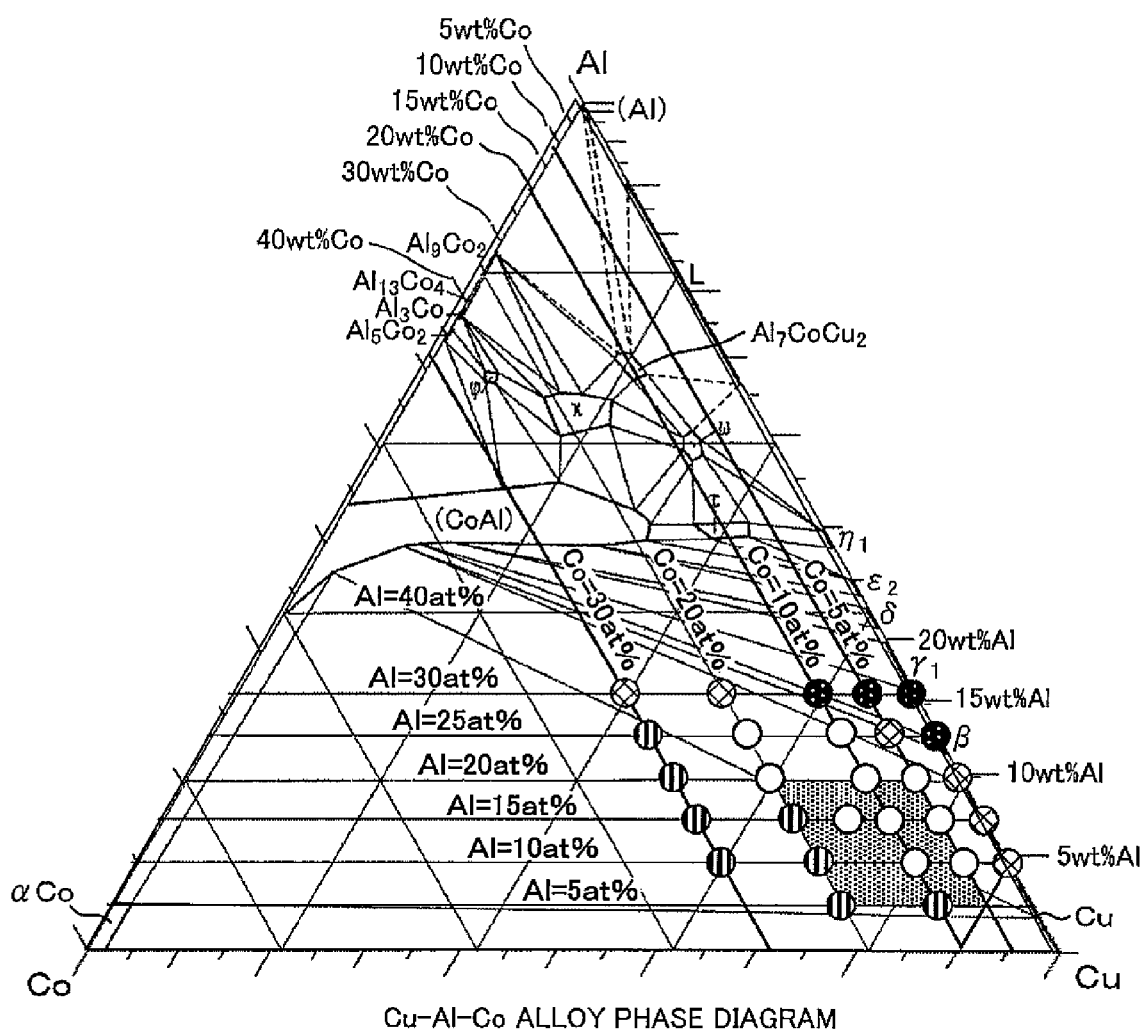
FIG. 9 is a view illustrating the relationship among a chemical composition, an oxidation resistance property, and an electrical resistance property in a Cu—Al—Co-based ternary alloy phase diagram.

FIG. 9 is created in the following manner: at each fixed point composition, an increase in weight and an electrical resistance due to oxidation, occurring when exposed to the atmosphere at 1000° C., were measured by a thermo-analytical method and a four-terminal method, respectively; and the results were represented by the four classification symbols inserted in the view, and then plotted on the phase diagram. Although the phase diagram represents a Cu—Al—Co-based ternary alloy phase diagram at 600° C., the states of the phases hardly change near the compositions at which the symbols have been plotted, even at a temperature higher than that. Additionally, in this phase diagram, an atom % (at %) and a percent by weight (wt % or mass %) are clearly indicated as an internal liner grid and an external scale mark, respectively. In an electronic component, in particular, in a system on film, tape carrier package, low temperature co-fired ceramics multilayer wiring board, plasma display, liquid crystal display, organic electroluminescent display, solar cell, or the like, if the electrical resistance is 10 μΩcm or less and the increase in weight due to oxidization, occurring when exposed to the atmosphere at 1000° C., is 0.5% or less, the specification of the aforementioned product can be sufficiently satisfied when the material is used as an electrode, a wiring, or a contact material. Accordingly, a position of a chemical composition having a property in which the aforementioned two conditions can be satisfied was denoted with a solid-white circle symbol in the phase diagram of FIG. 9. It has been found from the diagram that the composition range where the property represented by a solid-white circle symbol can be expressed is present in an Al content of 10 at % to 25 at % and a Co content of 5 at % to 20 at % in a Cu—Al—Co-based ternary alloy. The symbols of the coordinates in FIG. 9 have the meanings shown in Table 1.

TABLE 1

| | |
|---|---|
| ○ | Electrical Resistance ≤ 10 μΩcm |
| | Increase in Weight due to Oxidization, when Exposed to Atmosphere at 1000° C. ≤ 0.5% |
| ◉ | Electrical Resistance ≤ 10 μΩcm |
| | Increase in Weight due to Oxidization, when Exposed to Atmosphere at 1000° C. ≥ 1.0% |
| ◐ | Electrical Resistance > 10 μΩcm |
| | Increase in Weight due to Oxidization, when Exposed to Atmosphere at 1000° C. ≤ 1.0% |
| ● | Electrical Resistance > 10 μΩcm |
| | Increase in Weight due to Oxidization, when Exposed to Atmosphere at 1000° C. > 1.0% |

Subsequently, it will be discussed by using FIG. 10 that the composition in which an electrical resistance can be reduced to 10 μΩcm or less is present in a specific region in the Cu—Al—Co-based ternary alloy (FIG. 9).

Figure 10:
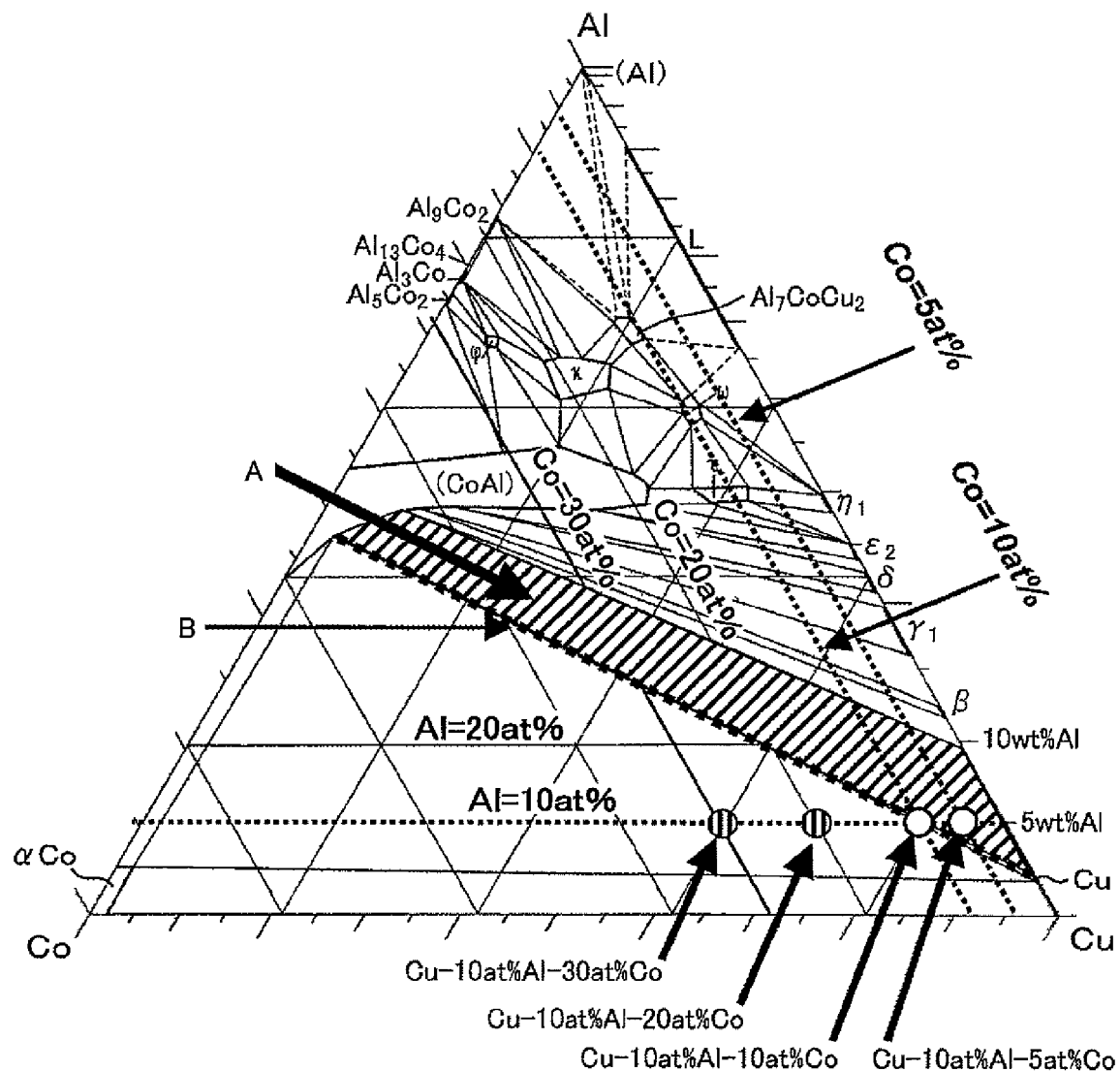
FIG. 10 is a view for explaining expression of a low electrical resistance by using the Cu—Al—Co-based ternary alloy phase diagram.

The meanings of the symbols in FIG. 10 are shown in Table 2.

TABLE 2

| | |
|---|---|
| ○ | Electrical Resistances ≤ 10 μΩcm |
| | Increase in Weight due to Oxidization, when Exposed to Atmosphere at 1000° C. ≤ 0.5% |
| ◐ | Electrical Resistance > 10 μΩcm |
| | Increase in Weight due to Oxidization, when Exposed to Atmosphere at 1000° C. ≤ 1.0% |

In FIGS. 9 and 10, β, $γ_1$, δ, $∈_2$, $η_1$, τ, ω, κ, and φ each representing an intermetallic compound usually appear in an equilibrium diagram. The source of them is edited by Petzow and G. Effenberg, Ternary Alloys, A Comprehensive Compendium of Evaluated Constitutional Data and Phase Diagrams, Volume 4, p. 170.

β; $AlCu_3$
$γ_1$; $Al_4Cu_9$
δ; —$Al_2Cu_3$ (<680° C.)
$∈_2$; —$Al_2Cu_3$ (<850-560° C.)
$η_1$; AlCu
τ; $Al_5CoCu_4$
ω; —$Al_6CoCu_3$
κ; —$Al_3CoCu$
φ—$Al_{10}Co_3Cu$

Arrow A indicates a diagonal line region representing a biphasic region of $Cu_{solid\ solution}$-$CoAl_{compound}$, while Arrow B indicates a composition line at which the Al concentration in the $Cu_{solid\ solution}$ becomes a minimum in the biphasic region of $Cu_{solid\ solution}$-$CoAl_{compound}$.

The internal grid indication in the ternary phase diagram of FIG. 9 represents an at %, while the external scale mark indication therein represents a % by weight (wt %).

FIG. 10 represents the same Cu—Al—Co-based ternary phase diagram at 600° C. as FIG. 9. For example, when the line at which an Al content is 10 at % is taken into consideration, it is found that, when a Co content is approximately 10 at % or less, the phase is included in a diagonal line region. In the diagonal line region, two phases of a Cu solid solution in which Al and Co have been dissolved into Cu (in the diagram, indicated as a $Cu_{solid\ solution}$) and a CoAl intermetallic compound (in the diagram, indicated as a $CoAl_{compound}$) coexist together. As a Co content in the region is made to be higher, an amount of the formed CoAl intermetallic compound is increased and the Al content in the Cu solid solution is decreased. Accordingly, at the composition line indicated by the dotted line in the diagonal line region (e.g., Cu-10 at % Al-10 at % Co), the Al content in the Cu solid solution becomes a minimum. That is, it can be considered that, because the electrical resistance in the Cu solid solution is made to be reduced with a decrease in the Al concentration, an amount of the formed compound of Al and Co is increased with an increase in the Co content in the diagonal line region, and accordingly, the Cu solid solution has changed the composition so as to come close to pure Cu, thereby the electrical resistance of the Cu solid solution being reduced. On the other hand, when an addition amount of Co is larger than, for example, 10 at % in the 10 at % Al composition line, Co in an amount larger than or equal to the amount in which Co forms a compound with Al is contained in a Cu solid solution. As a result, the electrical resistance of the Cu solid solution is increased with an increase in a Co content. Accordingly, it can be considered in this case that the electrical resistance exceeded the condition in which 10 μΩcm or less had been set as a specification, as illustrated in the diagram.

As a result, it can be made that an electrical resistance is 10 μΩcm or less and an increase in weight due to oxidization, occurring when exposed to the atmosphere at 1000° C., is 0.5% or less by a Cu—Al—Co-based ternary alloy in which an AL content is within a range of 10 at % to 25 at %, a Co content is within a range of 5 at % to 20 at %, and two phases of a Cu solid solution in which Al and Co have been dissolved into Cu and a CoAl intermetallic compound coexist together.

Based on the aforementioned basic test results, the present inventors have found that a ternary alloy in which Al and Co have been added to Cu has both properties of an extremely excellent oxidation resistance property and a low electrical resistance property, and accordingly have studied the possibility of the alloy being applied to an electronic component.

Figure 11:
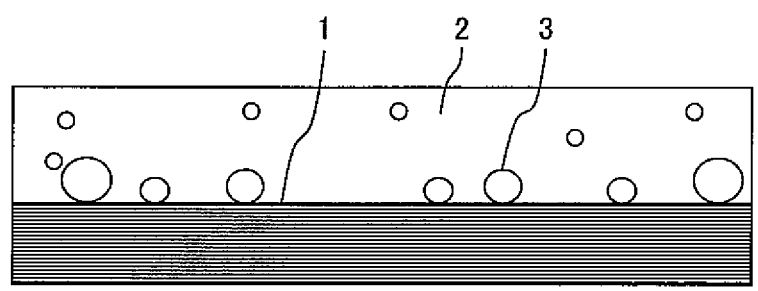
FIG. 11 is a view illustrating a generated state of bubbles generated in a dielectric glass on a pure Cu wiring.
Figure 12:
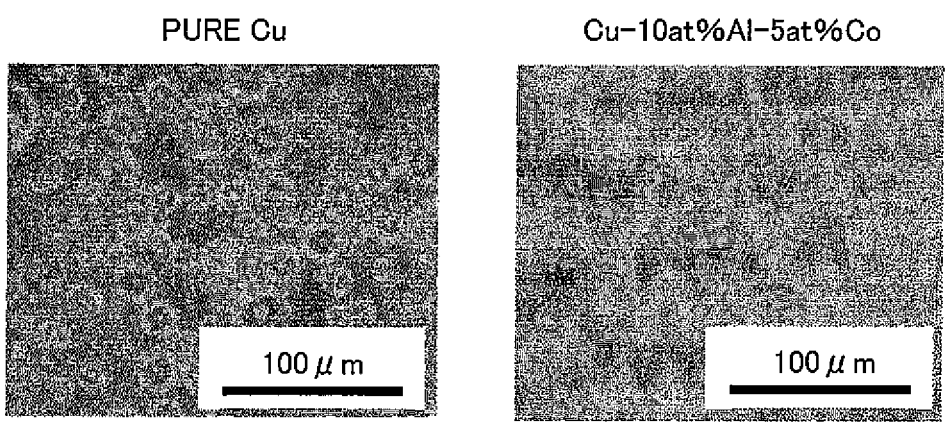
FIG. 12 is view illustrating test results for confirming whether bubbles are generated in dielectric glass on a pure Cu material and a Cu—Al—Co alloy material.

First, the applicability to a component having a sputtering wiring structure in contact with dielectric glass has been experimentally confirmed. The sputtering wiring structure was produced by a Cu-based material 1 produced by sputtering being embedded with dielectric glass paste and dried and then by subjecting the material to a heat treatment in the atmosphere at 610° C. for 30 minutes, as illustrated in FIG. 11. Herein, a Cu—Al—Co ternary alloy according to the present invention and comparative pure Cu were used as Cu-based materials 1. Oxidization behaviors of these Cu-based materials 1 were evaluated by observing the states where bubbles 3 were generated in a dielectric layer 2 with an optical microscope. The results obtained by performing the optical microscope observation from the side of the dielectric layer 2 in FIG. 11 are illustrated in FIG. 12. In the pure Cu, countless bubbles were generated, which indicates that oxidization remarkably made progress. On the other hand, in the Cu—Al—Co alloy, bubbles were not generated at all and oxidization did not occur. When 10 at % or more of Al and 5 at % or more of Co were added to Cu, bubbles were not generated at all likewise, and an electrical resistance was able to be made to be 10 μΩcm or less by setting the upper limit of an AL content to 25 at % and that of a Co content to 20 at %. As a result, it was confirmed that a Cu—Al—Co-based ternary alloy in which an Al content is 10 at % to 25 at % and a Co content is 5 at % to 20 at % can be applied to a metal material for an electronic component, the metal material being formed of a conductive metal material in contact with dielectric glass.

Figure 13:
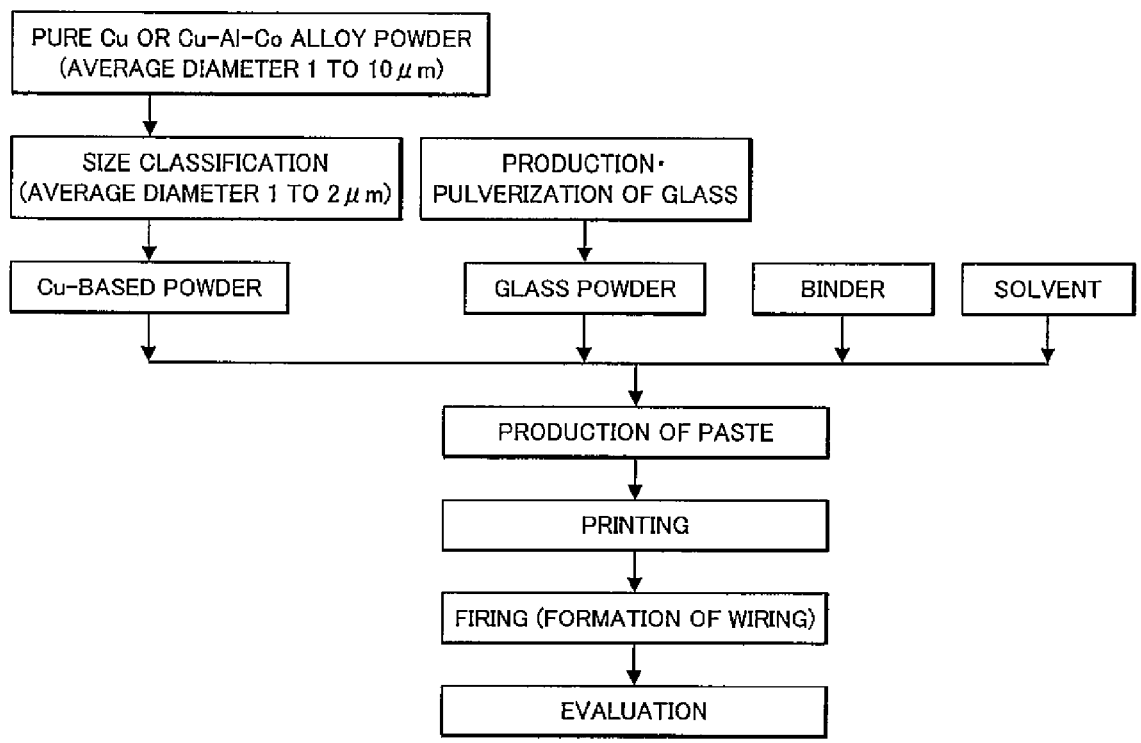
FIG. 13 is a flow chart illustrating a detailed production process of an electronic component wiring to be produced by mixing conductive metal particle powders and glass powders.

Secondly, the applicability to a metal material for an electronic component, composed of a conductive metal material produced by mixing conductive metal material powders and glass powders, was studied. FIG. 13 illustrates a detailed production process of two electronic component wirings, one of which was produced by mixing Cu—Al—Co alloy particle powders produced by an atomizing method, used as conductive metal material powders, and glass powders, and the other of which was produced by mixing pure Cu particle powders produced by the same method, used as a comparative material, and glass powders. The particle powder was made to have a size of the wiring thickness or less through size classification. Herein, the size classification was performed such that the average particle size of the particle powder was 1 to 2 μm. These conductive metal material powder particles and glass powders were formed into paste with a binder and a solvent such that a wiring was formed by a printing method, and then fired in the atmosphere at 400 to 800° C. for 30 minutes, thereby forming a final wiring. Although various methods can be adopted for the formation of a wiring, a low-cost screen printing method was adopted herein. As a result of thermal analyses of the atomized powders, an increase in weight was 0.5% or less even at 1000° C., when 10 at % or more of Al and 5 at % or more of Co had been added to Cu. The electrical resistance of the wiring finally formed was measured by using a four-terminal method.

It is preferable that the electrical resistance of a wiring for an electronic component is approximately 10 μΩcm or less. It has been found that, when fired in the atmosphere at 400° C. to 800° C., a wiring formed of a Cu—Al—Co-based alloy in which an Al content is 10 at % to 25 at % and a Co content is 5 at % to 20 at % has an electrical conductivity sufficient for a Cu wiring (10 μΩcm or less) and an electrical resistance lower than or equal to that of the wiring using Ag particles produced by the same method, and hence the wiring can be used instead of an Ag wiring. The particle powder produced by an atomizing method had a spherical shape, and the particle powder thereafter formed into a flake shape (plate shape) with a ball mill, etc., had the same effect. When spherically-shaped powders and flake-shaped powders were mixed together, the electrical resistance thereof after firing was able to be reduced approximately to half of that obtained when spherically-shaped powders were fired. Further, when a wiring was formed in accordance with the process in FIG. 13 after the aforementioned atomized powders were subjected to a heat treatment in vacuum, an inert gas, or a reducing atmosphere including hydrogen, at a temperature of 500° C. or higher, an electrical resistance was able to be reduced by a maximum of approximately 40% of that obtained when the atomized powers were used as they were.

In FIG. 13, the printing means a process where screen printing is performed on a glass substrate, the firing (formation of wiring) means a process where a firing treatment is performed in the atmosphere at 400° C. to 800° C., and the evaluation means a process where an electrical resistance is evaluated.

Figure 14:
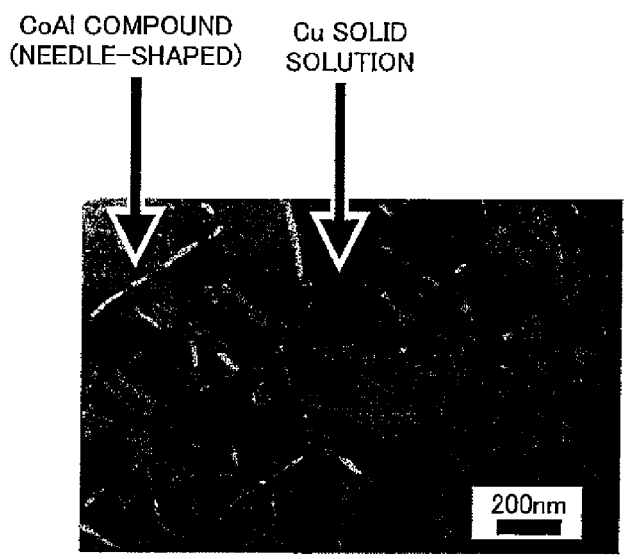
FIG. 14 is a transmission electron microscope photograph of a Cu-10 at % Al-10 at % Co alloy wiring.

The wiring illustrated in FIG. 14 is produced by the process illustrated in FIG. 13, in which the wiring was fired by a heat treatment performed in the atmosphere at 800° C. for three seconds using a tunnel furnace. In the structure observed with an electron microscope, a needle-shaped CoAl compound is generated in the base of a Cu solid-solution. This supports the aforementioned mechanism (discussion with respect to FIG. 10) by which an electrical resistance can be reduced by an effect of addition of Co.

From the aforementioned results, it has been made clear that, with a Cu—Al—Co-based ternary alloy conductive metal material composed of an Al content of 10 at % to 25 at, a Co content of 5 at % to 20 at %, and the balance of Cu and unavoidable impurities, in which two phases of a Cu solid-solution formed by Al and Co being dissolved into Cu and a CoAl intermetallic compound coexist together, a wiring, an electrode, or a contact part that has a material structure coexisting with glass or glass ceramics, and that is exposed to an oxidizing atmosphere during its production process and is produced by a method including a high temperature heat treatment process at 200° C. or higher, can be produced. Accordingly, by using the metal material for an electronic component according to the present invention in an electronic component product that has a chemical composition coexisting with glass or glass ceramics, and that is exposed to an oxidizing atmosphere during its production process and is produced by a method including a high temperature heat treatment process at 200° C. or higher, more substantially at 400° C. or higher, a Cu-based wiring, electrode, or contact part that is not oxidized can be produced. Thereby, an electronic component with high reliability, which is inexpensive and excellent in migration resistance property, can be provided. In the high temperature heat treatment process, the confirmed upper limit of the temperature below which the alloy according the invention is not oxidized is 1050° C., which is the range obtained by the current tests, and it has been confirmed that a component, such as an electrode or a wiring structure, can be formed in which the component is not oxidized even through a heat treatment process at a temperature up to 1050° C. or a heat treatment process in which the component coexists with glass or glass ceramics. Accordingly, a wiring, an electrode, or a contact part formed of the metal material for an electronic component consisting of the Cu—Al—Co-based ternary alloy according to the invention can be applied to an electronic component, such as a system on film (SOF), tape carrier package (TCP), low-temperature co-fired ceramics (LTCC) multilayer wiring board, plasma display (PDP), liquid crystal display (LCD), organic EL (Electroluminescent) display, solar cell, or the like. In the component, the oxidization resistance property according to the invention can be effectively exhibited.

Hereinafter, examples will be described in which embodiments of the present invention are shown.

Example 1

Figure 15:
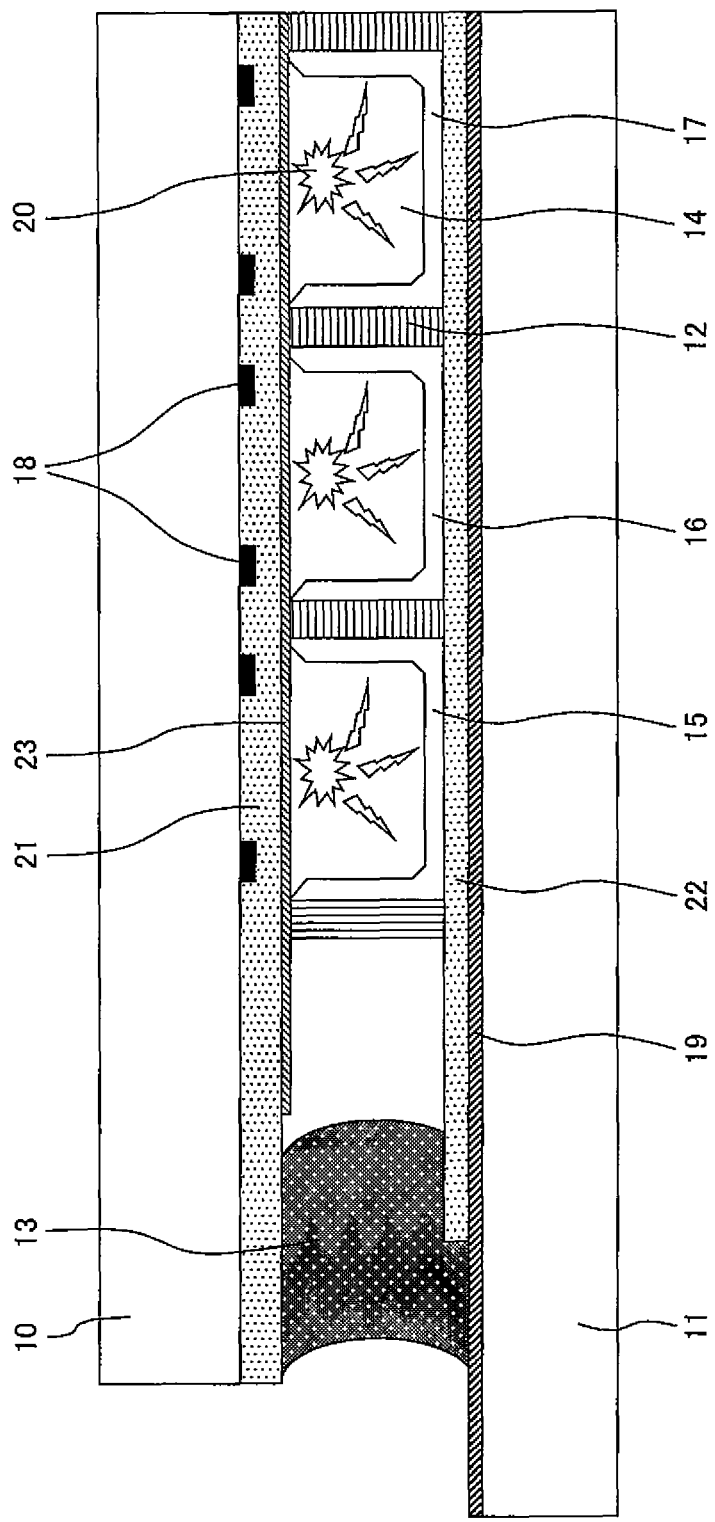
FIG. 15 is a sectional view of a plasma display using a wiring material according to the present invention.

An example in which the present invention is applied to a plasma display panel will be described. The schematic sectional view of the plasma display panel is illustrated in FIG. 15.

In the plasma display panel, a front panel 10 and a rear panel 11 are arranged so as to face each other with a space of 100 to 150 μm between them, and the gap between each substrate is maintained by a partition wall 12. The periphery of each of the front panel 10 and the rear panel 11 is airtightly sealed by a sealing material 13 such that the inside of the panel is filled with a rare gas. A micro-space (cell 14) partitioned by the partition wall 12 is filled with a phosphor. One pixel is formed by three cells each of which is filled with a red phosphor 15, a green phosphor 16, and a blue phosphor 17, respectively. Each pixel emits light with each color in accordance with a signal.

Electrodes regularly arranged on a glass substrate are provided on each of the front panel 10 and the rear panel 11. A display electrode 18 on the front panel 10 is paired with an address electrode 19 on the rear panel 11, and accordingly a voltage of 100 V to 200 V is selectively applied between them in accordance with a display signal. Thus, ultraviolet light 20 is generated by a discharge between the electrodes to make the phosphor 15, 16, or 17 emit light, thereby allowing picture information to be displayed. The display electrode 18 and the address electrode 19 are respectively covered with dielectric layers 21 and 22 in order to protect these electrodes and to control a wall charge at the discharge. Thick glass films are used for the dielectric layers 21 and 22.

In the rear plate 11, the partition wall 12 is provided on the dielectric layer 22 of the address electrode 19 to form the cell 14. The partition wall 12 is a stripe-shaped or box-shaped structure.

In general, an Ag thick film wiring is currently used for the display electrode 18 and the address electrode 19. As stated above, it is preferable to adopt a Cu thick film wiring instead of an Ag thick film wiring for cost reduction and for dealing with the migration of Ag; however, the following conditions must be satisfied to achieve that: a Cu thick film can be formed in an oxidizing atmosphere; the electrical resistance of Cu is not decreased by the oxidization of the Cu at firing; a dielectric layer can be formed in an oxidizing atmosphere; the electrical resistance of Cu is not decreased by the oxidization of the Cu, occurring due to the reaction of the Cu and the dielectric layer at firing; and a pressure resistance property is not decreased by the generation of voids (bubbles) near the Cu thick film wiring, etc. Although the display electrode 18 and the address electrode 19 can be formed by a sputtering method, a printing method is more advantageous in terms of price reduction. In addition, the dielectric layers 21 and 22 are generally formed by a printing method. The display electrode 18, the address electrode 19, and the dielectric layers 21 and 22, all of which are formed by a printing method, are generally fired in an oxidizing atmosphere at a temperature within a range of 450 to 620° C.

After the display electrode 18 is formed on the surface of the front panel 10 so as to cross, at right angles, the address electrode 19 on the rear panel 11, the dielectric layer 21 is formed on the whole surface of the front panel 10. A protective layer 23 is formed on the dielectric layer 21 to protect the display electrode 18, etc., from discharge. In general, a deposited film of MgO is used for the protective layer 23. On the other hand, after the address electrode 19 is formed on the rear panel 11, the dielectric layer 22 is formed in a cell formation area followed by provision of the partition wall 12 thereon. The partition wall formed of a glass structure is composed of a structure material containing at least a glass composition and fillers, and is formed of a fired body obtained by firing the structure material. The partition wall 12 can be formed in the following manner: a volatile sheet in which a groove has been provided is stuck to a partition wall portion such that paste for the partition wall is cast into the groove; and the paste is fired at a temperature of 500 to 600° C. to volatilize the sheet and to form the partition wall 12. Alternatively, the partition wall 12 can be formed in the following manner: paste for the partition wall is applied to the whole surface by a printing method and is masked after being dried; an unnecessary portion of the paste is removed by sandblast or chemical etching; and the paste is fired at a temperature of 500 to 600° C. Each of the phosphors 15, 16, and 17 is formed by filling the cell 14 partitioned by the partition wall 12 with paste for each of the phosphors 15, 16, and 17 having each color, and then by firing it at a temperature of 450 to 500° C.

The front panel 10 and the rear panel 11, which have been formed separately, are usually arranged so as to face each other at accurate positions, and the periphery of each of them is sealed with glass at a temperature of 420 to 500° C. The sealing material 13 is beforehand formed on the periphery of either of the front panel 10 and rear panel 11 by a dispenser method or a printing method. The sealing material 13 is generally formed on the rear panel 11. Alternatively, the sealing material 13 is sometimes calcined beforehand and simultaneously with the firing of the phosphors 15, 16, and 17. With this method, the bubbles to be generated in a glass sealing portion can be remarkably reduced, thereby allowing a glass sealing portion with high airtightness, i.e., with high reliability to be obtained. The panel is completed by discharging, in glass sealing, a gas in the cell 14 while heating the cell 14 and then by enclosing a rare gas. There are sometimes the cases where, during the calcination of the sealing material 13 or the glass sealing, the sealing material 13 is directly in contact with the display electrode 18 or the address electrode 19, which is not preferable because the electrical resistance of a wiring material of which the electrode is formed is increased by a reaction of the wiring material and the sealing material 13. Accordingly, it is needed to prevent the reaction.

For the lighting of the completed panel, a voltage is applied at a portion where the display electrode 18 and the address electrode 19 intersect with each other such that the rare gas in the cell 14 is discharged to make a plasma state. Thereafter, the phosphors 15, 16, and 17 are made to emit light by using the ultraviolet light 20 generated when the rare gas in the cell 14 returns to an original state from the plasma state. Thereby, the panel is made to emit light such that picture information is displayed. When each of the colors is intended to be lighted, an address discharge is performed between the display electrode 18 and the address electrode 19 of the cell 14 to be lighted, so that a wall charge is accumulated in the cell. When a certain voltage is subsequently applied to a pair of the display electrodes, a display discharge occurs only in the cell where the wall charge has been accumulated by the address discharge, so that picture information is displayed in the mechanism of making a phosphor emit light by generating the ultraviolet light 20.

Figure 16:
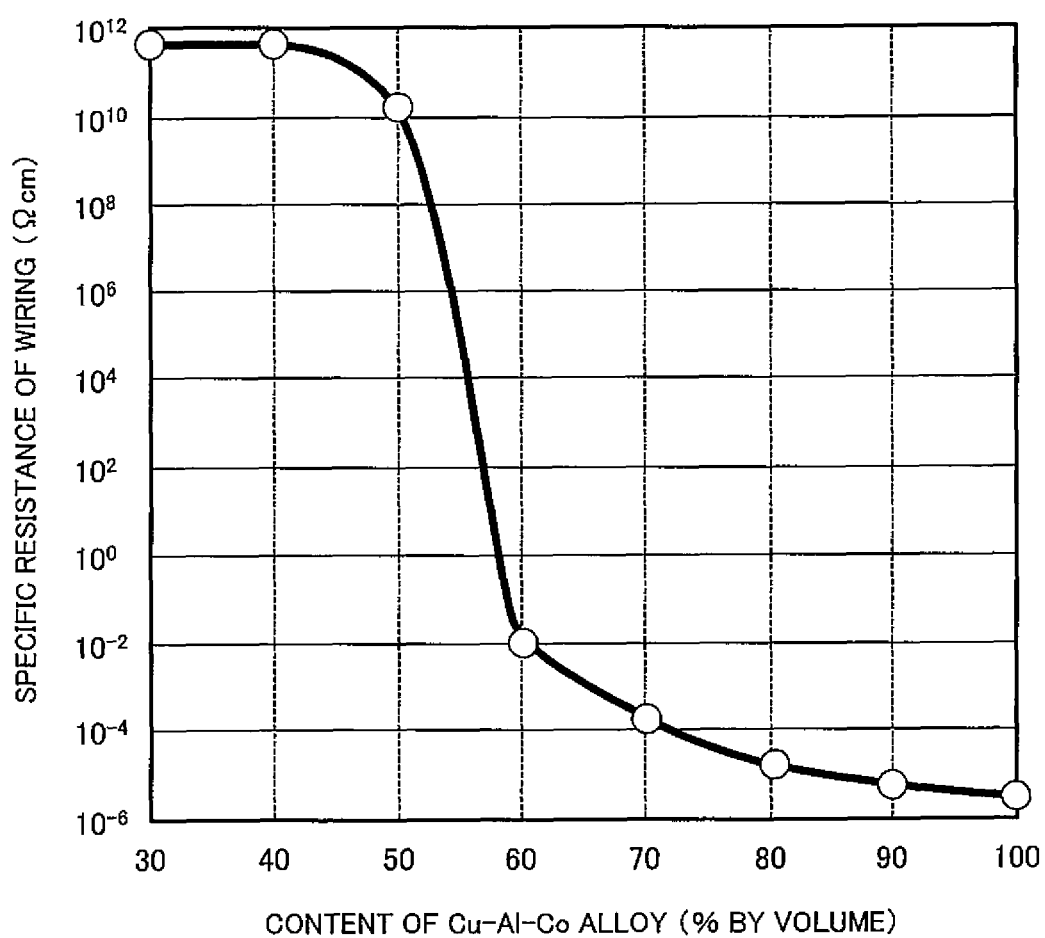
FIG. 16 is a graph illustrating the relationship between the specific resistance of an electronic component wiring and a content of Cu—Al—Co alloy powders in a mixture of conductive metal particle powders and glass powders.

It has been first studied whether a wiring material made from the Cu—Al—Co alloy powders according to the present invention and glass powders may be applied to the display electrode 18 on the front panel 10 and the address electrode 19 on the rear panel 11. The wiring material was formed into wiring paste by mixing various ratios of the Cu—Al—Co alloy powders having an average particle size of 1 to 2 μm to the glass powders having an average particle size of 1 μm and further by adding a binder and a solvent. Lead-free low softening point glass having a softening point of approximately 450° C., ethyl cellulose, and butyl carbitol acetate were used as the glass powders, the binder, and the solvent, respectively. The produced wiring paste was applied onto a glass substrate to be used in a plasma display panel by using a printing method, and then heated in the atmosphere at 530° C. for 30 minutes to form a wiring. The electrical resistance of the produced wiring was measured to calculate a specific resistance. FIG. 16 illustrates the relationship between a content of the Cu—Al—Co alloy powder according to the invention and the specific resistance of a wiring. It has been confirmed that, a wiring, in which the content of the Cu—Al—Co alloy powder is 75% by volume or more (content of glass powder is 25% by volume or less), is hardly oxidized and the specific resistance thereof is sufficiently low. Accordingly, the Cu—Al—Co alloy powder according to the invention can be used as a wiring material by making the content of glass powder to be 25% by volume or less. Further, a better oxidization resistance property can be provided by making the content of the Cu—Al—Co alloy powder to be 85% by volume or more (content of glass powder is 15% by volume or less), and hence it is preferable to make the content of the Cu—Al—Co alloy powder to be 85% by volume or more. In these cases, the Cu—Al—Co alloy powder can be provided with an oxidization resistance property by 10 at % to 25 at % of Al being added to Cu and by simultaneously adding 5 at % or more of Co thereto in the chemical composition of the Cu—Al—Co alloy powder; however, a sufficient oxidization resistance property and a low electrical resistance property can be secured by preferably adding Co in an amount within a range up to 20 at % along the composition line indicated by the dotted line in the Cu solid solution-CoAl compound biphasic alloy in FIG. 10, at which the Al content in the Cu solid solution becomes a minimum. However, the Cu—Al—Co alloy powders contained unavoidable impurities.

When the content of the glass powder in a wiring was made to be small, the wiring was more likely to peel off from the glass substrate used as the front panel or the rear panel. When the content of the glass powder was 3% by volume or more, a wire was able to be formed to be strongly fixed to the glass substrate. That is, the Cu—Al—Co alloy powder can be effectively used as a wiring material by making the content of the Cu—Al—Co alloy powder to be 65 to 97% by volume and the content of the glass powder to be 3 to 35% by volume. The upper limit of the content of the glass powder is preferably 25% by volume or less, and more preferably 15% by volume or less, in terms of making an electrical resistance to be low. In addition, when filler powders having a low thermal expansion coefficient are further mixed into a wiring material, the wiring more hardly peels off. However, because a specific resistance is increased when the filler powders are mixed, it is usually needed to make the content thereof to be 20% by volume or less.

For confirmation of what have been described above, the same tests were performed by using pure Cu powders in a wiring material, as a comparative example. As a result of that, the wiring material was remarkably oxidized by heating in the atmosphere at 530° C., and hence the material was not be able to be used as a wiring material.

From the result of the aforementioned study, a wiring material consisting of 85% by volume of Cu—Al—Co alloy powders having an average particle size of 1 to 2 μm and 15% by volume of glass powders having an average particle size of 1 μm, was selected, so that the plasma display panel illustrated in FIG. 15 was experimentally produced by applying the wiring material to the display electrode 18 on the front panel 10 and the address electrode 19 on the rear panel 11. The wiring material was formed into wiring paste by mixing, in the same way as described above, ethyl cellulose and butyl carbitol acetate as a binder and a solvent, respectively. The paste was applied onto the front panel 10 and the rear panel 11 by a printing method and fired in the atmosphere at 530° C. for 30 minutes, thereby forming the display electrode 18 and the address electrode 19. The glass of each of the dielectric layers 21 and 22 was further applied thereof. The glass of each of the dielectric layers 21 and 22 was formed in the same way as described above: paste was formed by mixing a binder and a solvent into glass powders having an average particle size of 1 μm; and the paste was applied onto approximately the whole surface by a printing method and then fired in the atmosphere at 610° C. for 30 minutes. Lead-free glass having a softening temperature of approximately 560° C., ethyl cellulose, and butyl carbitol acetate were used as the glass powder, the binder, and the solvent, respectively. The front panel 10 and the rear panel 11 were separately produced and the periphery of each of them was sealed with glass, thereby forming a plasma display panel. The display electrode 18 and the address electrode 19 using the wiring material according to the present invention did not change in color occurring due to oxidization, and a void was not generated in each of the interfaces between the display electrode 18 and the dielectric layer 21 and between the address electrode 19 and the dielectric layer 22, and accordingly it has been found that the display electrode 18 and the address electrode 19 can be mounted on a panel.

Subsequently, tests for lighting the produced plasma display panel were performed. The panel was able to be lighted without an increase in the electrical resistance of each of the display electrode 18 and the address electrode 19, without a decrease in the pressure resistance property thereof, and further without migration as occurring in Ag. No other trouble was observed.

The wiring material according to the present invention can be applied to a wiring material for a solar cell, etc., not limited to that for a plasma display panel. Currently, a wiring material consisting of Ag powders and glass powders is also used for a wiring of a solar cell, and a large cost reduction was able to be achieved by changing to the wiring material according to the invention.

Example 2

In the plasma display panel in FIG. 15 produced in Example 1, a wiring material for the display electrode 18 or the address electrode 19 were formed by a sputtering method. As illustrated in FIG. 17, a three layer structure was made as the wiring material by sequentially forming a chromium metal film 24, a Cu—Al—Co alloy film 25 according to the present invention, and again a chromium metal film 26. The chromium metal film 24 for the first layer was formed to increase the adhesion between the front panel 10 or the rear panel 11 and the Cu—Al—Co alloy film, and the chromium metal film 26 for the third layer was formed to increase the wettability with the dielectric layers 21 and 22. The thickness of the chromium metal film 24 for the first layer was made to be 0.2 µm, that of the Cu—Al—Co alloy film 25 for the second layer was made to be 3.0 µm, and that of the chromium metal film 26 for the third layer was made to be 0.1 µm, thereby forming the plasma display panel in the same way as in Example 1 to be evaluated. Herein, a disk made of a bulk material of metal Cr and that made of a bulk material of the Cu—Al alloy were used as sputtering targets for the formation of the respective layers.

It has been found that a void was not generated in the side area of each of the display electrode 18 and the address electrode 19, thereby allowing both of the electrodes to be mounted on a panel. Subsequently, tests for lighting the produced plasma display panel were performed. As a result of that, the panel was able to be lighted without an increase in the electrical resistance of each of the display electrode 18 and the address electrode 19, without a decrease in the pressure resistance property thereof, and further without migration as occurring in Ag. No other trouble was observed.

For confirmation of what have been described above, a wiring material was formed, as a comparative example, by changing the Cu—Al—Co alloy film 25 for the second layer to a pure Cu film to be mounted in the display electrode 18 and the address electrode 19, thereby experimentally forming a panel in the same way as described above. Many voids were observed between the side area of the display electrode 18 and the interface of the dielectric layer 21 and between the side area of the address electrode 19 and the interface of the dielectric layer 22, causing the withstand voltage to be decreased by half.

Because good panel evaluation results were obtained for the display electrode 18 and the address electrode 19 formed of the aforementioned three-layer wiring made by a sputtering method, a two-layer wiring obtained by excluding the chromium metal film 26 for the third layer was mounted in each of the display electrode 18 and the address electrode 19, thereby forming the plasma display panel in FIG. 15. As in the same way as described above, the thickness of the chromium metal film 24 for the first layer was made to be 0.2 µm and that of the Cu—Al—Co alloy film for the second layer was made to be 3.0 µm. The display electrode 18 and the address electrode 19 using the wiring material according to the present invention did not change in color occurring due to oxidization, and a void was not generated in each of the interfaces between the display electrode 18 and the dielectric layer 21 and between the address electrode 19 and the dielectric layer 22, and accordingly it has been found that the display electrode 18 and the address electrode 19 can be mounted on a panel. Subsequently, tests for lighting the produced plasma display panel were performed. As a result of that, no trouble was observed in the same way as described above, and accordingly it has been found that a good panel can be produced even by a two-layer wiring.

Figure 18:
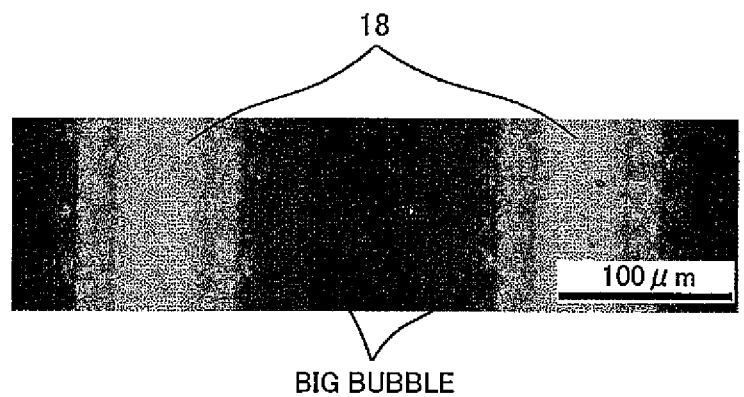
FIG. 18 is a view illustrating a result of optical microscopic observation of the bubbles generated in dielectric glass from a comparative electronic component wiring using pure Cu.

Also with respect to this, for confirmation of what have been described above, a wiring material was formed, as a comparative example, by changing the Cu—Al—Co alloy film 25 for the second layer to a pure Cu film to be mounted in the display electrode 18 and the address electrode 19, thereby experimentally forming a panel in the same way as described above. The pure Cu film in each of the display electrode 18 and the address electrode 19 was remarkably oxidized and many voids were generated in the interfaces with the dielectric layers 21 and 22. FIG. 18 illustrates a result of optical microscope observation of big bubbles generated between the wiring formed of the pure Cu film and the dielectric layer. The bubbles were generated by a reaction of an oxide layer formed on the surface of a wiring material with a dielectric layer, occurring at a high temperature. Accordingly, the pure Cu film was not be able to be applied to a panel.

As explained above, generation of bubbles occurring due to a reaction with a dielectric can be suppressed by using a display electrode formed of a Cu—Al—Co alloy the lowest layer of which uses Cr, regardless of the presence/absence of Cr in the uppermost layer thereof. Similarly, the adhesion between the Cu—Al—Co alloy and a rear plate can be maintained even when the lowest layer is formed of an oxidized Cr layer. By using an oxidized Cr layer, the thickness of which has been adjusted, for the lowest layer and by making the light reflected on the surface of the oxidized Cr layer interfere with the light reflected on the surface of the Cu—Al—Co alloy, the color tone of a display electrode can be adjusted when viewed from the front, and accordingly the color tone can be made to be, for example, black to dark color or brown.

Example 3

In the experimental production of a panel in Example 2, a sputtering target for the Cu—Al—Co alloy film applied to a wiring material has been studied. In Example 2, a sputtering target made of a Cu—Al—Co alloy was used. In the present Example, it has been confirmed whether a desired Cu—Al—Co alloy film was able to be formed by using sputtering targets other than that.

Figure 19:
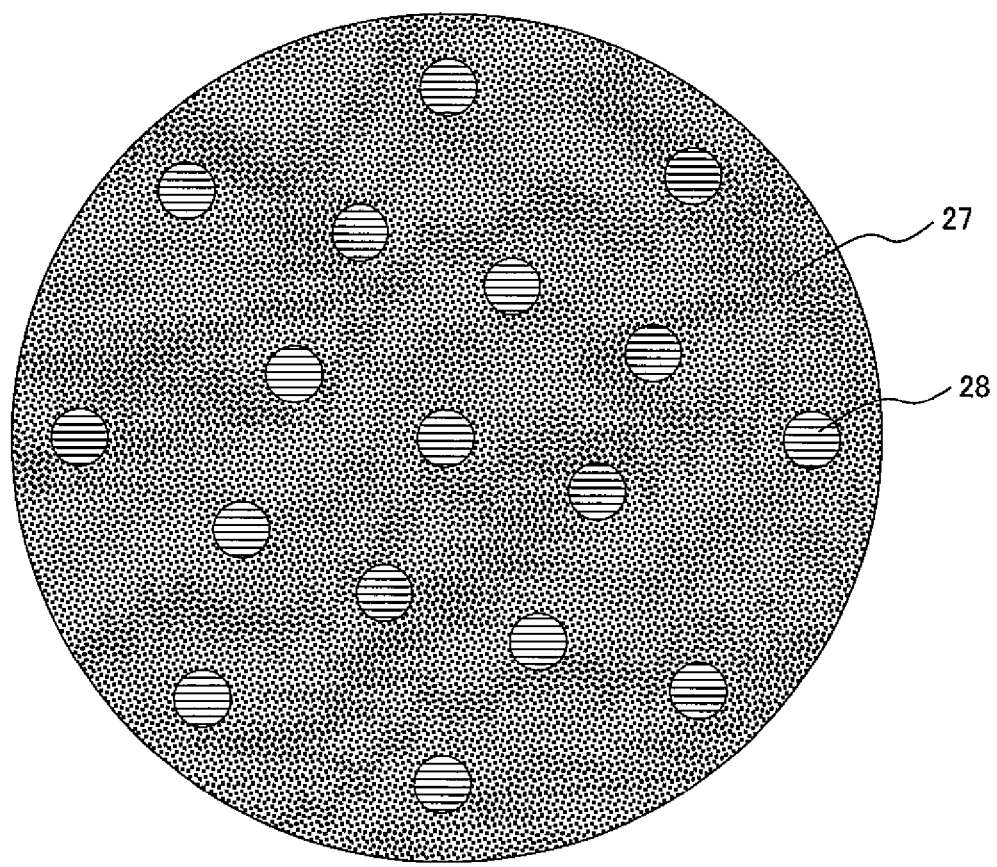
FIG. 19 is a view illustrating an example of a sputtering target according to the present invention.

A sputtering target was first produced in which each of Cu, Al, and Co individually constitutes a target as a single metal, as illustrated in FIG. 19. The sputtering target was produced by providing many through-holes in a disk 27 made of pure Cu such that pure Al 28 and pure Co 28 each having a shape fit to that of the through-hole were enclosed therein and by polishing the surface of the disk. The filling of the pure Cu disk with the pure Al and pure Co was performed by determining the size of the through-hole and the number of the through-holes, taking into consideration the composition uniformity of the film formed by sputtering. Although a circular shape (cylindrical shape) is illustrated in FIG. 19, the through-hole may have a rectangular shape (rectangular parallelepiped), or a target having a fan-like surface shape made of Cu may be used in which the Cu and Al metal or Co metal are alternately combined together. As a result of forming films using this sputtering target, a Cu—Al—Co alloy film having the same quality as the sputtering target made of a Cu—Al—Co alloy was obtained in which Cu, Al, and Co were compositionally mixed together in desired concentrations. That is, it has been found that a sputtered film in which a change in an electrical resistance occurring due to oxidization is small and a reaction with the glass of a dielectric layer hardly occurs, can be obtained by the sputtering target according to the present example. Further, a Cu—Al—Co alloy having predetermined contents of Al and Co can be formed by using a plurality of sputtering targets including a sputtering target made of Cu alone, that made of Al alone, and that made of Co alone. In this case, a method of performing sputtering while a plurality of targets are being rotated, a method of forming a Cu—Al—Co alloy by subjecting, to a heat treatment, a laminated film made of Cu, Al, and Co that has been formed by repeatedly performing sputtering of Cu, Al, and Co while changing the targets to be sputtered, or the like can be adopted.

It is possible to produce the sputtering target according to the present example at a lower cost than a sputtering target made of a Cu—Al—Co alloy. A sputtering target made of a Cu—Al—Co alloy is required to be produced from an original bulk material of the Cu—Al—Co alloy. In the sputtering target according to the present example, however, there is the merit that the sputtering target can be produced by combining pure Cu, pure Al, and pure Co, which are widely available in the world.

Example 4

Figure 20:
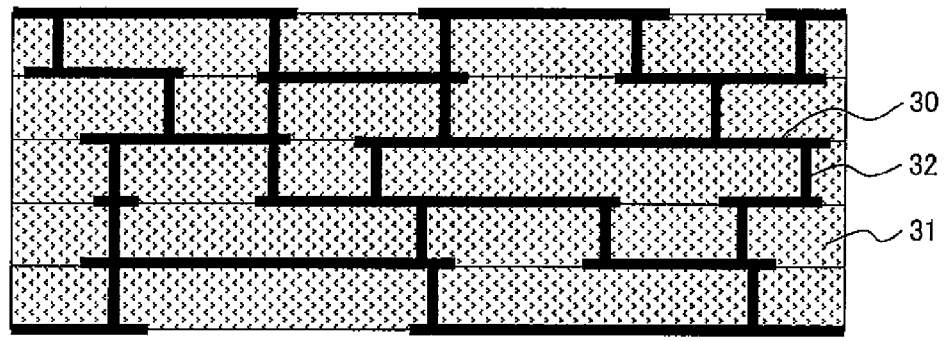
FIG. 20 is a sectional view of a low-temperature co-fired glass ceramics multilayer wiring board using the wiring material according to the present invention.

In the present example, a multilayer wiring board (five layers) made of LTCC (Low Temperature Co-fired Ceramics) illustrated in FIG. 20 was produced. Wirings 30 are formed in a three-dimensional manner. In this production method, a green sheet 31 made of glass powders and ceramics powders is first produced and through-holes 32 are provided at desired positions therein. Subsequently, paste for the wiring 30 is applied by a printing method and the though-hole 32 is filled with the paste. The paste for the wiring 30 is also applied onto the rear surface of the green sheet 31, if necessary. In the case, the application is performed after the paste for wiring 30 applied onto the front surface has been dried. The multilayer wiring board made of LTCC is produced by laminating one on another the green sheets 31 in each of which the paste for wiring 30 has been formed and by usually firing it in the atmosphere at approximately 900° C. Expensive Ag paste is usually used as the paste for wiring 30. When Cu paste, which is advantageous for dealing with migration and inexpensive, is used, the firing is performed in a nitrogen atmosphere; however, removal of a binder cannot be performed well, and hence it has been difficult to obtain a dense multiplayer wiring board. Also, there has been the problem that the electric resistance of the wiring 30 becomes large by the oxidization of Cu occurring due to the softening and flowing of glass in an area where the glass in the green sheet 31 and the wiring 30 made of Cu are in contact with each other. In addition, a void occurring due to a reaction with the glass has sometimes been generated, which is an undesired phenomenon because of possible disconnection of the wiring 30.

Figure 21:
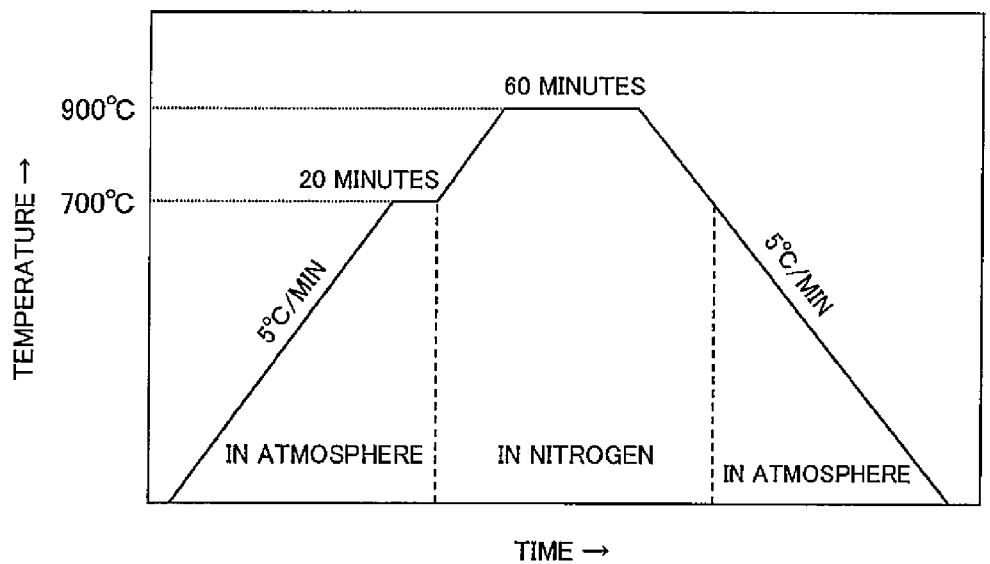
FIG. 21 is a view for illustrating a heat treatment condition under which the multilayer wiring board is fired.

In the present example, the Cu—Al—Co alloy powders (average particle size: 1 μm) according to the present invention were used as the paste for wiring 30. In addition, cellulose nitrate in which a carbon residue is small and butyl acetate were used as a binder and a solvent, respectively. By using the paste for wiring 30 composed of these materials, the multilayer wiring board (five layers) in FIG. 15 was produced. The multilayer wiring board was fired, as illustrated in the temperature profile in FIG. 21, in the atmosphere up to 700° C. and in a nitrogen atmosphere between 700° C. and 900° C., because the Cu—Al—Co alloy according to the present invention (in the present example, Cu-10 at % Al-5 at % Co was used) is not oxidized at all in the atmosphere at a temperature up to 1050° C. When the multilayer wiring board was cooled to 700° C. after being held in the nitrogen atmosphere at 900° C. for 60 minutes, the multilayer wiring board was held in the atmosphere. In the multilayer wiring board thus produced, removal of the binder was almost fully completed up to 700° C., the multilayer wiring board was densely fired. Further, the wiring 30 made of the Cu—Al—Co alloy was hardly oxidized and accordingly the electrical resistance was not increased at all. Furthermore, a void occurring near the wiring due to a reaction with the glass was not generated, thereby allowing a multilayer wiring board to be provided in which high performance and cost reduction are both satisfied. A temperature profile and an atmosphere used in the heat treatment are not limited thereto, and the same effect was able to be obtained even in a heat treatment in the atmosphere at 900° C. by making an Al content to be 10 at % to 25 at %, a Co content to be 5 at % to 20 at %, and the balance to be composed of Cu and unavoidable impurities. In this case, a sufficient oxidization resistance property and a low electrical resistance property can be secured by adding Co along the composition line indicated by the dotted line in the Cu solid solution-CoAl compound biphasic alloy in FIG. 10, at which the Al content in the Cu solid solution becomes a minimum.

Example 5

Figure 22:
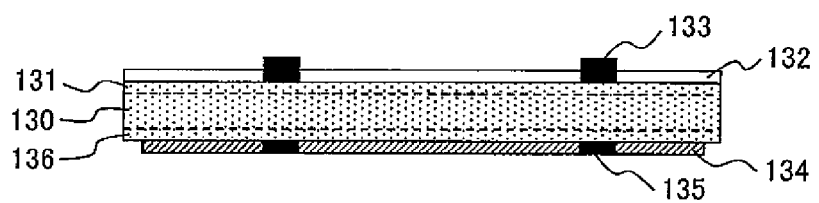
FIG. 22 is a sectional view illustrating the configuration of a typical solar cell element.
Figure 23:
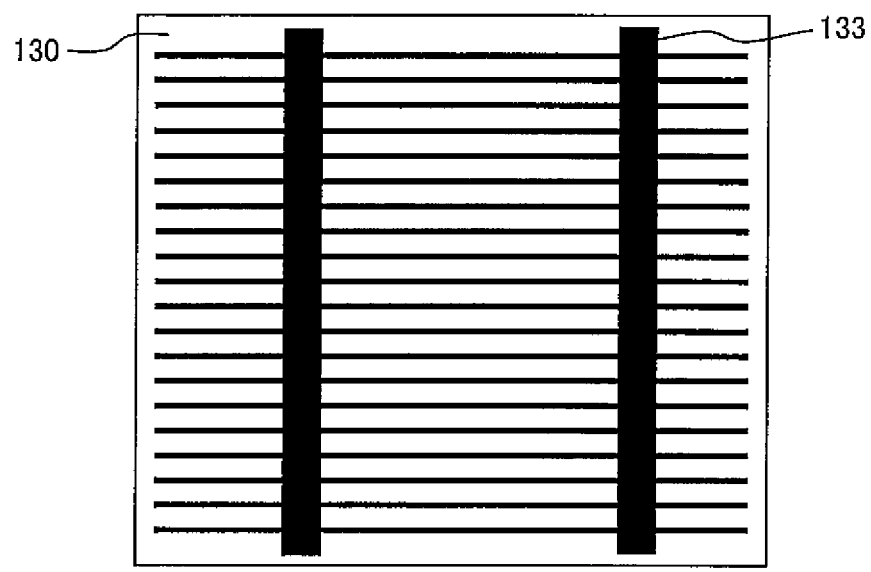
FIG. 23 is a view of the light-receiving surface illustrating the configuration of the typical solar cell element.
Figure 24:
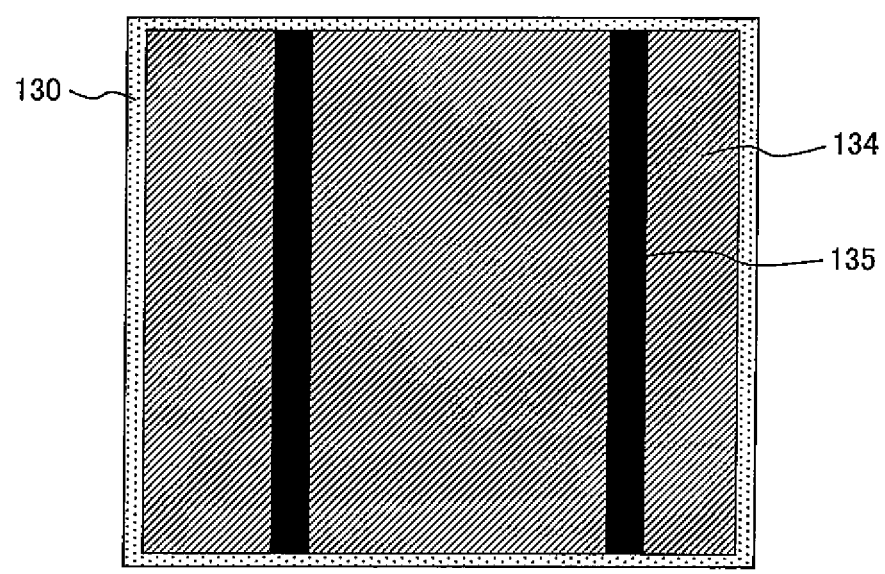
FIG. 24 is a view of the rear surface illustrating the configuration of the typical solar cell element.

In the present example, an example will be described in which the electrode according to the present invention is applied to an electrode in a solar cell element. FIGS. 22, 23, and 24 schematically illustrate the sectional view, the light-receiving surface, and the rear surface of a typical solar cell element, respectively.

Usually, single-crystalline or polycrystalline silicon is used for a semiconductor substrate 130 in a solar cell element. The semiconductor substrate 130 contains boron, etc., and is made to be a p-type semiconductor. Concavities and convexities are formed on the light-receiving surface by etching in order to suppress the reflection of sunlight. By doping phosphorus, etc., into the light-receiving surface, an n-type semiconductor diffusion layer 131 is formed to have a thickness of submicron order, and a pn-junction is formed in the boundary with a p-type bulk portion. In addition, an anti-reflection layer 132 made of silicon nitride, etc., having a thickness of approximately 100 nm is formed on the light-receiving surface by a vapor deposition method, etc.

Subsequently, formation of each of a light-receiving surface electrode 133 to be formed on the light receiving surface, a current collecting electrode 134 to be formed on the rear surface, and an output collector electrode 135 will be described. Usually, silver electrode paste containing glass powders is used for the light-receiving surface electrode 133 and the output collector electrode 135 and aluminum electrode paste containing glass powders is used for the current collecting electrode 134, which are applied by a screen printing. After being dried, these pastes are fired in the atmosphere at a temperature of approximately 500 to 800° C., thereby forming the electrodes. In this case, the glass composition contained in the light-receiving surface electrode 133 reacts with the anti-reflection layer 132 on the light-receiving surface, thereby allowing the light-receiving surface electrode 133 and the diffusion layer 131 to be electrically connected. While on the rear surface, the aluminum contained in the current collecting electrode 134 diffuses onto the rear surface of the semiconductor substrate 130 to form an electrode component diffusion layer 136, and hence an ohmic contact can be obtained among the semiconductor substrate 130, the current collecting electrode 134, and the output collector electrode 135.

The solar cell element illustrated in FIGS. 22 to 24 was experimentally produced by applying the same Cu—Al—Co metal particles as used in Example 1 and a phosphoric acid solution to the light-receiving surface electrode 133 and the output collector electrode 135. The metal particles were dispersed into the phosphoric acid solution by adding 30 parts by weight of the phosphoric acid solution based on 100 parts by weight of the Cu—Al—Co metal particles and then by emitting ultrasonic waves for 30 minutes. This was used as paste for the light-receiving surface electrode 133 and the output collector electrode 135.

The above aluminum electrode paste for the current collecting electrode 134 was first applied onto the rear surface of the semiconductor substrate 130 by a screen printing method, as illustrated in FIGS. 22 and 24. After being dried, the paste was heated in the atmosphere to 600° C. by an infrared rapid heating furnace. The paste was held at 600° C. for 3 minutes. Thereby, the current collecting electrode 134 was first formed on the rear surface of the semiconductor substrate 130.

Subsequently, the above paste was applied to the light-receiving surface of the semiconductor substrate 130, on which the diffusion layer 131 and the anti-reflection layer 132 had been formed, and the rear surface thereof, on which the current collecting electrode 134 had already been formed, by a screen printing method, as illustrated in FIGS. 22 to 24. After being dried, the paste was heated in the atmosphere to 750° C. in an infrared rapid heating furnace. The paste was held at the temperature for 1 minute.

In the solar cell element thus produced, the light-receiving surface electrode 133 and the semiconductor substrate 103 on which the diffusion layer 131 had been formed were electrically connected together on the light-receiving surface. The electrode component diffusion layer 136 was formed on the rear surface, and an ohmic contact was able to be obtained among the semiconductor substrate 130, the current collecting electrode 134, and the output collector electrode 135. Further, after a high temperature and humidity test performed at 85° C. and 85% for 100 hours, an increase in the wiring resistance and the contact resistance of each of the electrodes hardly occurred.

The solar cell element similarly operated even when the chemical composition of the Cu—Al—Co metal particle to be used was changed such that the AL content was within a range of 10 at % to 25 at %, the Co content was within a range of 5 at % to 20 at %, and the balance is composed of Cu and unavoidable impurities, and hence it has been confirmed that the composition of the metal particle can be selected from wide range. In this case, a sufficient oxidization resistance property and a low electrical resistance property can be secured by adding Co along the composition line indicated by the dotted line in the Cu solid solution-CoAl compound biphasic alloy in FIG. 10, at which the Al content in the Cu solid solution becomes a minimum. Further, it has been confirmed that each electrode can be formed by subjecting the light-receiving surface and the rear surface to a heat treatment at 800° C. for 3 seconds, and when the heat treatment is performed at a temperature of 1050° C. or lower, heat treatment conditions fit for various solar cell element structures can be selected.

From the aforementioned descriptions, it has been found that an electrode according to the present invention can be developed as the electrode of a solar cell element, in the same way as the plasma display panel described in Example 1. Further, because the electrode of the invention can be used instead of an expensive Ag electrode, thereby contributing to cost reduction.

A plasma display panel and a solar cell element have been described above as typical application examples of the present invention; however, the electrode according to the invention should not be limited to these two electronic components, but can be applied to the electrodes of other electronic components. In particular, in an electronic component using many expensive Ag electrodes, a large cost reduction can be achieved by applying the electrode according to the invention.

DESCRIPTION OF REFERENCE NUMERALS

1 Cu-BASED MATERIAL
2, 21, 22 DIELECTRIC LAYER
3 BUBBLE
10 FRONT PANEL
11 REAR PANEL
12 PARTITION WALL
13 SEALING MATERIAL
14 CELL
15, 16, 17 RED, GREEN AND BLUE PHOSPHOR
18 DISPLAY ELECTRODE
19 ADDRESS ELECTRODE
20 ULTRAVIOLET LIGHT
23 PROTECTIVE LAYER
24, 26 CHROMIUM METAL FILM
25 Cu—Al—Co ALLOY FILM
27 DISK MADE OF PURE Cu
28 PURE Al AND PURE Co
30 WIRING
31 GREEN SHEET
32 THROUGH-HOLE
130 SEMICONDUCTOR SUBSTRATE
131 DIFFUSION LAYER
132 ANTI-REFLECTION LAYER
133 LIGHT-RECEIVING SURFACE ELECTRODE
134 CURRENT COLLECTING ELECTRODE
135 OUTPUT COLLECTOR ELECTRODE
136 ELECTRODE COMPONENT DIFFUSION LAYER

The invention claimed is:

1. An electronic component having an electrode or a wiring, wherein
part or the whole of the electrode or the wiring has a chemical composition in which an Al content is 10 at % to 25 at %, a Co content is 5 at % to 20 at %, and the balance is composed of Cu and unavoidable impurities, and the chemical composition represents a ternary alloy in which two phases of a Cu solid solution formed by Al and Co being dissolved into Cu and a CoAl intermetallic compound coexist together.

2. The electronic component according to claim 1 having a structure in which the electrode or the wiring is in contact with a glass or glass ceramics member.

3. The electronic component according to claim 1, wherein each of the electrode and the wiring is formed on a substrate by a sputtering method and is covered with glass or glass ceramics, followed by firing.

4. The electronic component according to claim 1, wherein each of the electrode and the wiring further contains a glass component.

5. The electronic component according to claim 1, wherein the electrode or the wiring is formed in a hole and on the surface of a green sheet made of glass or glass ceramics by a printing method, and the wiring is installed in a three-dimensional manner by laminating and firing the green sheet.

6. An electronic component, wherein
the electronic component according to claim 1 is any one of a system on film, a tape carrier package, low temperature co-fired ceramics, a plasma display, a liquid crystal display, an organic electroluminescent display, and a solar cell.

7. An electrode or wiring material made by mixing at least conductive metal material powders and glass powders, wherein
the conductive metal material powder is a ternary alloy having a chemical composition composed of an Al content of 10 at % to 25 at %, a Co content of 5 at % to 20 at %, and the balance of Cu and unavoidable impurities.

8. The electrode or wiring material according to claim 7, wherein the conductive metal material powder has a spherical-shaped or plate-shaped particle powder form.

9. The electrode or wiring material according to claim 7 composed of 75 to 97% by volume of the conductive metal material powder and 3 to 25% by volume of the glass powder.

10. An electrode or wiring paste material formed by mixing a resin binder and a solvent into the electrode or wiring material according to claim 7.

* * * * *